US008858755B2

(12) United States Patent
Goodman et al.

(10) Patent No.: US 8,858,755 B2
(45) Date of Patent: Oct. 14, 2014

(54) EDGE BEVEL REMOVAL APPARATUS AND METHOD

(75) Inventors: Daniel Goodman, Lexington, MA (US); Arthur Keigler, Wellesley, MA (US); Terry McElroy, Arlington, MA (US); Gary Boulet, Rindge, NH (US)

(73) Assignee: Tel Nexx, Inc., Billerica, MA (US)

( * ) Notice: Subject to any disclaimer, the term of this patent is extended or adjusted under 35 U.S.C. 154(b) by 10 days.

(21) Appl. No.: 13/595,785

(22) Filed: Aug. 27, 2012

(65) Prior Publication Data

US 2013/0048610 A1 Feb. 28, 2013

Related U.S. Application Data

(60) Provisional application No. 61/527,810, filed on Aug. 26, 2011.

(51) Int. Cl.
*B44C 1/22* (2006.01)
*H01L 21/67* (2006.01)
*H01L 21/02* (2006.01)

(52) U.S. Cl.
CPC .............. *B44C 1/22* (2013.01); *H01L 21/6719* (2013.01); *H01L 21/02087* (2013.01); *H01L 21/6708* (2013.01); *Y10S 134/902* (2013.01)
USPC ............ 156/345.55; 156/345.23; 156/345.15; 134/902; 216/91

(58) Field of Classification Search
USPC ........... 156/345.23, 345.15, 345.55; 134/902; 216/91
See application file for complete search history.

(56) References Cited

U.S. PATENT DOCUMENTS

| 3,293,093 A | 12/1966 | Jones et al. |
| 3,668,131 A | 6/1972 | Banush et al. |
| 4,158,593 A | 6/1979 | Allan et al. |
| 4,395,302 A | 7/1983 | Courduvelis |
| 4,401,509 A | 8/1983 | Schellinger, Jr. |
| 6,015,467 A * | 1/2000 | Nagasawa et al. ............ 134/1 |
| 6,398,975 B1 | 6/2002 | Mertens et al. |
| 6,649,077 B2 * | 11/2003 | Tsai et al. ........................ 216/92 |

(Continued)

FOREIGN PATENT DOCUMENTS

WO   WO 2005/042804 A2   5/2005

OTHER PUBLICATIONS

U.S. Appl. No. 13/356,252, Goodman et al., filed Jan. 23, 2012.
U.S. Appl. No. 13/444,570, Keigler et al., filed Apr. 11, 2012.

(Continued)

*Primary Examiner* — Sylvia R Macarthur
(74) *Attorney, Agent, or Firm* — Rothwell, Figg, Ernst & Manbeck, P.C.

(57) ABSTRACT

A substrate edge bevel etch module for etching a material from a peripheral edge of a substrate with an etchant is described. The substrate edge bevel etch module includes a rotatable substrate holder having a support for a substrate, and a surface tension etch applicator comprising a wetted etching surface opposing a substrate surface proximate an edge of the substrate when the surface tension etch applicator is located proximate to the edge of the substrate. The surface tension etch applicator further includes an etchant dispensing portion, proximate the wetted etching surface, which dispenses an etchant in a region between the wetted etching surface and the substrate surface and wet at least a portion of the wetted etching surface and the substrate surface. A spacing between the wetted etching surface and the substrate surface is selected to retain the etchant using surface tension forces and form a meniscus there between.

25 Claims, 27 Drawing Sheets

(56) References Cited

U.S. PATENT DOCUMENTS

| | | | |
|---|---|---|---|
| 6,954,993 B1 * | 10/2005 | Smith et al. | 34/407 |
| 7,000,622 B2 | 2/2006 | Woods et al. | |
| 7,122,126 B1 * | 10/2006 | Fuentes | 216/90 |
| 7,445,697 B2 | 11/2008 | Keigler et al. | |
| 7,722,747 B2 | 5/2010 | Keigler et al. | |
| 7,727,366 B2 | 6/2010 | Keigler et al. | |
| 7,780,867 B1 | 8/2010 | Mayer et al. | |
| 7,850,866 B2 | 12/2010 | Jo et al. | |
| 2004/0226916 A1 * | 11/2004 | Kobayashi et al. | 216/83 |
| 2005/0167275 A1 | 8/2005 | Keigler et al. | |
| 2008/0237188 A1 * | 10/2008 | Kajino et al. | 216/93 |
| 2010/0288312 A1 * | 11/2010 | Frank et al. | 134/30 |

OTHER PUBLICATIONS

Myhre, et al., Density and Surface Tension of Aqueous H2SO4 at Low Temperature, Journal of Chemical and Engineering Data, vol. 43, No. 4, 1998, pp. 617-622.

\* cited by examiner

EDGE BEVEL REMOVAL APPARATUS AND METHOD

CROSS-REFERENCE TO RELATED APPLICATIONS

Pursuant to 37 CFR §1.78(a)(4), this application claims the benefit of and priority to U.S. Provisional Application Ser. No. 61/527,810, filed on Aug. 26, 2011, the entire content of which is herein incorporated by reference.

FIELD OF INVENTION

The invention relates, generally to an edge bevel removal apparatus and method of operating thereof.

BACKGROUND OF THE INVENTION

Wet processing, among other processes. Is used as a fabrication technique for the application or removal of thin films and materials to and from various structures and surfaces, including substrates processed in semiconductor and electronic device manufacturing. As an example, wet processing may include Edge-Bevel-Removal (EBR) or Edge-Bevel-Etch (EBE) processes for removing undesirable material, such as copper or other contamination from the edge region of a substrate following metallization, including plating, Edge-Bevel-Removal (EBR) processes typically require precise positioning of an etchant proximate the edge of a substrate. For example, in wet spray-type systems, fluid nozzles precisely direct an etchant spray or jet toward the edge of the substrate during rotation of the substrate. However, problems exist, among others, relating to the design of the fluid nozzle, including the manufacture of the exit orifice diameter with precision, as well as its precise positioning relative to the substrate, which preset challenges in both the manufacture and implementation of such fluid nozzles. Any variance in the manufacture or position of the fluid nozzle can result in unacceptable variations of the exit velocity, etch rate, etch uniformity, and concentricity. Accordingly, there is a desire to provide an EBR apparatus and method of operating that alleviates at least some of these drawbacks of wet spray-type systems.

SUMMARY OF THE INVENTION

Embodiments of the invention relate to an edge bevel removal apparatus and method of operating thereof. In particular, embodiments of the invention relate to an apparatus and method of dispensing an etchant on a substrate surface and retaining the etchant between the substrate surface and the apparatus using surface tension forces.

According to an example of one embodiment, a substrate edge bevel etch module adapted to etch a material from a peripheral edge of a substrate with an etchant is described. The substrate edge bevel etch module includes a rotatable substrate-holder having a support configured to support a substrate, and a surface tension etch applicator comprising a wetted etching surface configured to oppose a substrate surface proximate an edge of the substrate when the surface tension etch applicator is located proximate to the edge of the substrate. The surface tension etch applicator further includes an etchant dispensing portion proximate the wetted etching surface that is adapted to dispense an etchant in a region between the wetted etching surface and the substrate surface and wet at least a portion of the wetted etching surface and the substrate surface, wherein a spacing between the wetted etching surface and the substrate surface can be selected to retain the etchant using surface tension forces and form a meniscus there between.

According to an example of another embodiment, a substrate edge bevel etch apparatus configured to be coupled to a substrate processing module and adapted to etch a material from a peripheral edge of a substrate with an etchant is described. The substrate edge bevel etch apparatus includes a surface tension etch applicator comprising a wetted etching surface configured to oppose a substrate surface proximate an edge of a substrate when the surface tension etch applicator is located proximate to the edge of the substrate. The surface tension etch applicator further includes an etchant dispensing portion proximate the wetted etching surface that is adapted to dispense an etchant in a region between the wetted etching surface and the substrate surface and wet at least a portion of the wetted etching surface and the substrate surface, wherein a spacing between the wetted etching surface and the substrate surface can be selected to retain the etchant using surface tension forces and form a meniscus there between.

According to another example of yet another embodiment a method of etching a material from a peripheral edge of a substrate with an etchant is described. The method includes placing a substrate on a rotatable substrate holder, and locating a surface tension etch applicator proximate an edge of the substrate such that a wetted etching surface of the surface tension etch applicator is positioned opposite a substrate surface. The surface tension etch applicator further includes an etchant dispensing portion, proximate the wetted etching surface that is adapted to dispense an etchant in a region between the wetted etching surface and the substrate surface and wet at least a portion of the wetted etching surface and the substrate surface. The method, further includes selecting a spacing between the wetted etching surface and the substrate surface to retain die etchant using surface tension forces and form, a meniscus there between, rotating the rotatable substrate holder, and dispensing the etchant within the region between the wetted etching surface and the substrate surface.

As should be apparent, the invention can provide a number of advantageous features and benefits. It is to be understood that, in practicing the invention, an embodiment can be constructed to include one or mote features or benefits of embodiments disclosed herein but not others. Accordingly, it is to be understood that the preferred embodiments discussed herein are provided as examples and are not to be construed as limiting, particularly since embodiments can be formed to practice the invention that do not include each of the features of the disclosed examples.

BRIEF DESCRIPTION OF THE DRAWINGS

The invention will become further apparent from the following description, particularly when considered in conjunction with the drawings in which.

DETAILED DESCRIPTION OF SEVERAL EMBODIMENTS

In the following description, for purposes of explanation and not limitation, specific details are set forth by way of example, such as a particular geometry of a processing system, descriptions of various components and processes used therein. However, it should be understood that the invention may be practiced in other embodiments that, depart from these specific details.

Similarly, for purposes of explanation, specific numbers, materials, and configurations are set forth in order to provide a thorough understanding of the invention. Nevertheless, the invention may be practiced without or with other specific details, furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be perforated and/or described operations may be omitted in additional embodiments.

"Substrate" as used herein genetically refers to the object being processed in accordance with the invention. The substrate may include any material portion or structure of a device, particularly a semiconductor or other electronics device, and may, for example, be abase substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Figure 1:
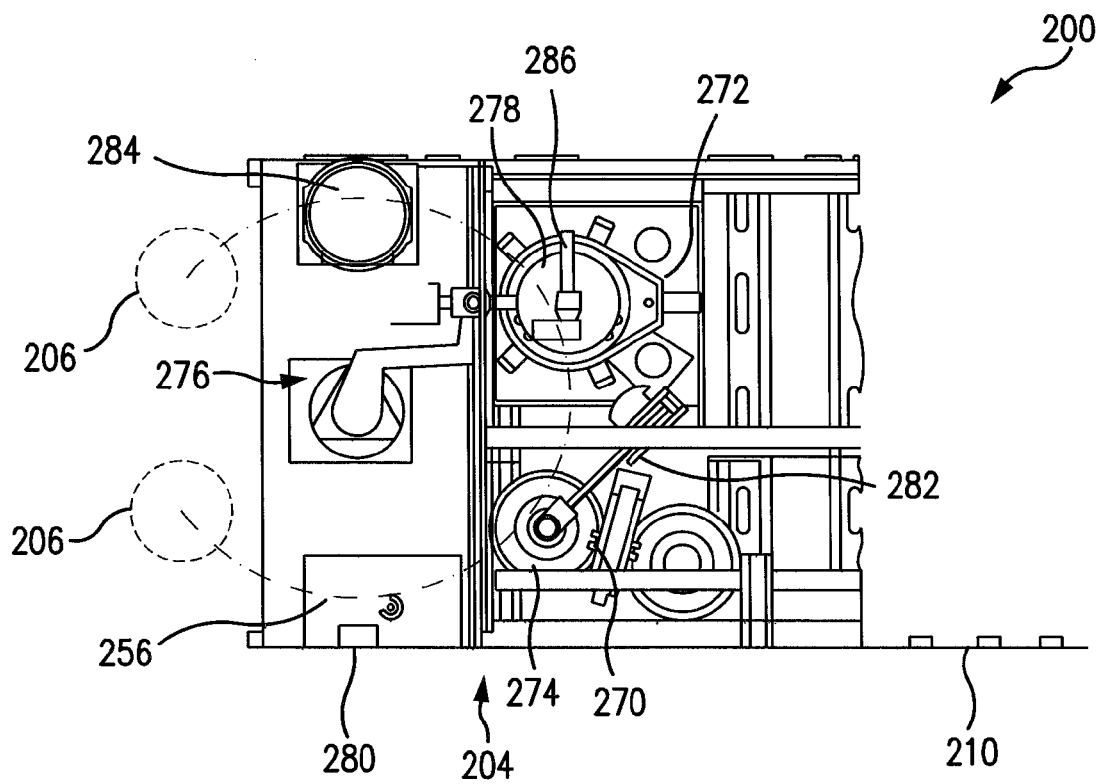
FIG. 1 shows an exemplary substrate processing system.

Referring now to FIG. 1, a substrate processing apparatus 200 suitable for a manufacturing process, including a Surface Tension Etch Process (STEP), is shown in accordance with the present disclosed embodiments that will be described in greater detail below. The disclosed embodiments may be implemented in as electro-deposition machine, such as the STRATUS (commercially available from TEL NEXX, Inc., Billerica, Mass.), by way of example. Substrate processing apparatus 200 may incorporate features, as described in the International Patent Application Publication No. WO 2005/042804 A2, published May 12, 2005 (having a counterpart U.S. Pat. No. 7,722,747), and as described in U.S. Patent Application Publication No. 2005/0167275, published Aug. 14, 2005, and entitled "Method and apparatus for fluid, processing a work piece"; both of which are hereby incorporated by reference herein in their entirety.

In alternate embodiments, the disclosed embodiments may be utilized in any suitable processing system or in combination with processing systems, for example cleaning systems, etching systems, deposition systems, or any suitable system that may utilize rinsing and/or drying of substrates either alone or in combination. Substrate processing apparatus 200 is shown as an exemplary system. In alternate embodiments, the number of modules may be more or less, and may be provided having different configurations and locations. The term "module" is used herein to refer to different sections or portions of the substrate processing apparatus 200, and though such sections may be modular or separable in construct if desired (i.e., capable of being installed or removed from the machine substantially as a unit), the use of the term module is not intended to limit the construct of such section or portion of the machine to a modular construct.

Substrate processing apparatus 200 may contain load ports 206 by which substrates previously processed, such as being patterned with photoresist or otherwise processed, are inserted and withdrawn, from the substrate processing apparatus 200. Loading station 204 may have a robotic arm 276 which transfers substrate 278 into wafer loader module 274, wherein wafer loader module 274 may load substrate 278 to holder 270. Further, robotic arm 276 may transfer substrate 278 into a spin-rinse-dry (SRD) module 272, wherein spin-rinse-dry (SRD) module 272 may clean, dry, or otherwise process substrate 278, as will be described in greater detail below, for example, with an Edge Bevel Removal (EBR) etching process or otherwise.

In FIG. 1, the relative location of the spin-rinse-dry (SRD) module 272 within the front end of the substrate processing apparatus 200 is shown with die spin-rinse-dry (SRD) module 272 positioned within the motion envelope 256 of the robotic arm 276. Furthermore, robotic arm 276 may transfer substrate 278 into pre-aligner 280, pick-up flip (PUF) device 282, or buffer modules 284. In alternate embodiments, the number of modules may be more or less, and may be provided in any suitable combination with, spin-rinse-dry (SRD) module 272. For example, in alternate embodiments, robotic arm 276 may transport a single-substrate (or wafer), a batch of substrates (or wafers), or a combination thereof. Also by way of example, alternate embodiments may be provided with more or less robotic arms, or spin-rinse-dry modules. Furthermore, in alternate embodiments, any suitable module may be provided in combination with spin-rinse-dry (SRD) module 272.

Loading station 204 may support any suitable arrangement of process modules 210 of substrate processing apparatus 200. For example, process modules 210 may include a combination of cleaning, etching and/or electro-deposition modules. In alternate embodiments, the number of modules may be provided in any suitable combination. As such, all variations, alternatives, and modifications of the configuration for substrate processing apparatus 200 are herein embraced.

Spin-rinse-dry (SRD) module 272 may be provided to remove material from an edge of a wafer or substrate in an edge bevel removal process as described below. Spin-rinse-dry (SRD) module 272 may be provided to clean substrates or wafers, for example, after they have been unloaded from holder 270 or pick-up flip (PUF) device 282. Spin-rinse-dry (SRD) module 272 may be provided with additional features, such, as those features disclosed in U.S. patent application Ser. No. 13/356,252, filed on Jan. 23, 2012, and entitled "Substrate holder"; which is hereby incorporated by reference herein in its entirety.

Substrates or wafers may be unloaded and transferred to the spin-rinse-dry (SRD) module 272 after their wet processing has been completed. Spin-rinse-dry (SRD) module 272 may use DI (deionized) water or other materials, wherein no solvents or reagents may be used after processing, for example, after Edge Bevel Removal (EBR) processing. Spin-rinse-dry (SRD) module 272 may operate at ambient temperature and pressure, wherein spin-rinse-dry (SRD) module 272 may clean resist and EBR/contact regions at the substrate (or wafer) edge. For example, the regions at the substrate, (or wafer) edge may include, among others, the region covered by the contact ring seal (CRS) during plating, rinsing and drying operations. Spin-rinse-dry (SRD) module 272 may utilize directed nozzles 286 that apply clean de-ionized (DI) rinse water to the substrate (or wafer) surface as it spins.

The process performed in spin-rinse-dry (SRD) module 272 may be divided into three principle stages, namely: (i) Edge Bevel Etch; (ii) wash; and (iii) dry. During the Edge Bevel Etch stage, unwanted copper, or other unwanted metal(s), or contamination or unwanted material residing on the edge region of die substrate following plating is removed, as will be described below in greater detail. Daring the wash stage, the substrate (or wafer) rotates slowly while DI water is streamed onto the wafer under conditions of controlled pressure and flow. An exemplary (relatively low-speed) wash stage includes rotation at 150 rpm (revolutions per minute). An exemplary wash stage includes a process time of approximately 15 seconds. An exemplary wash stage includes a flow rate of approximately 1 lpm (liters per minute), wherein an exemplary pressure of 50-60 psi (pounds per square inch) is desired.

During the dry stage, after the preset tints for the wash stage, die substrate (or wafer) may be further processed for drying. Drying may be accomplished by ejecting water from the surface by centrifugal force. The substrate (or wafer) is rotated at relatively high speed until all trace water is substantially removed from the surface, resulting in a clean, dry processed substrate (or wafer). An exemplary (relatively high-speed) dry stage includes rotation in the range from about 1000-3000 rpm. Spin-rinse-dry (SRD) module 272 may be a single chamber able to hold, rinse, and dry one substrate (or wafer) at a time. Spin-rinse-dry (SRD) module 272 chamber(s) may be optimised to dry at high speed with an exemplary SRD processing time of less than 60 seconds (total).

Figure 2:
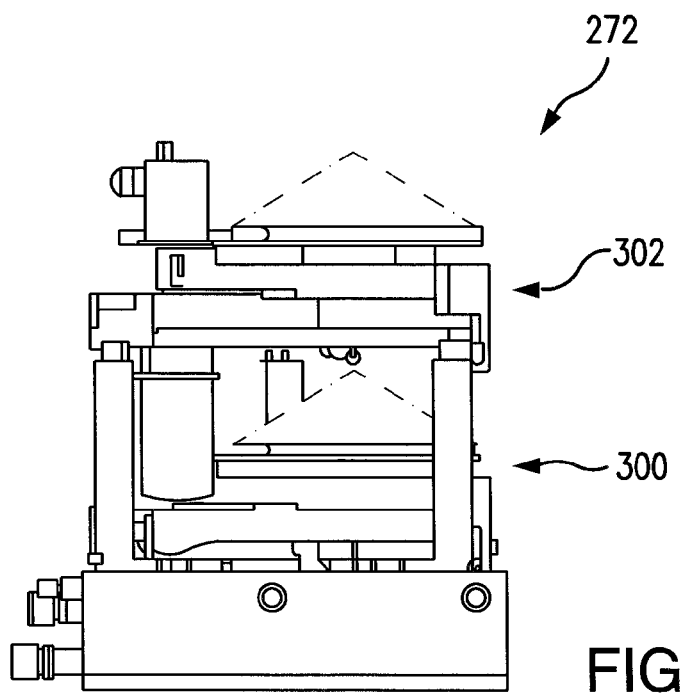
FIG. 2 shows a side view of a stacked spin-rinse-dry (SRD) module.
Figure 3:
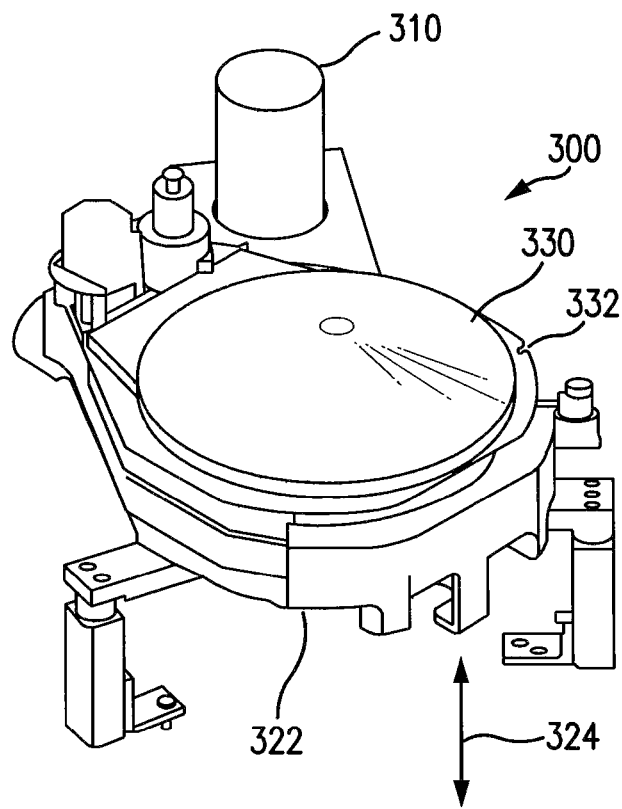
FIG. 3 shows an isometric view of a spin-rinse-dry (SRD) module.
Figure 4:
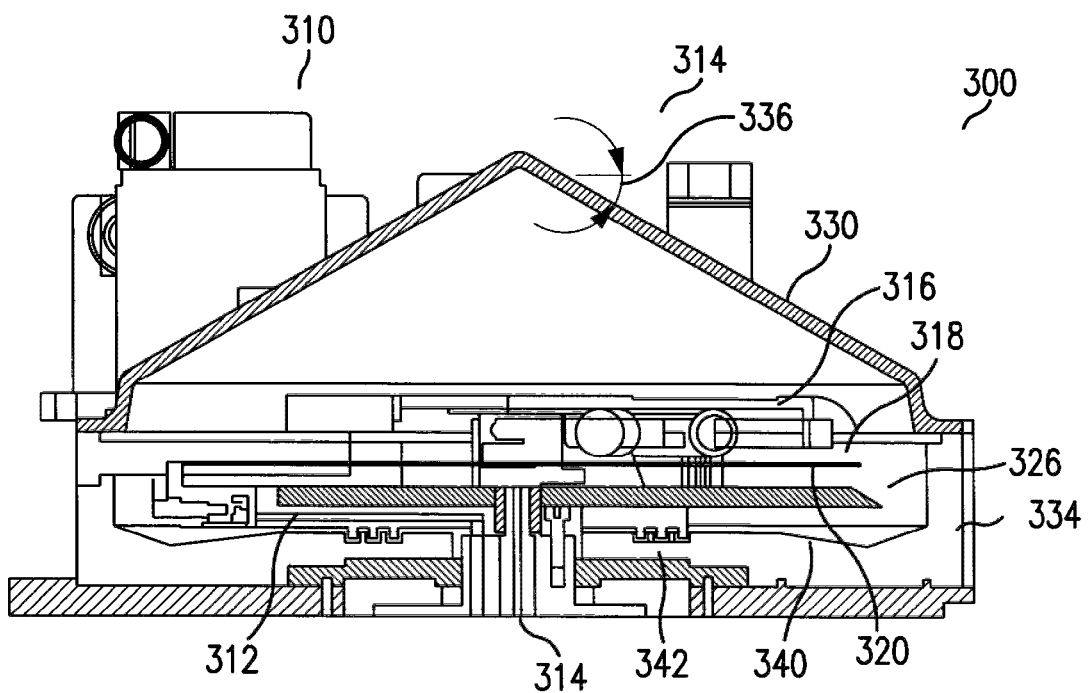
FIG. 4 shows a section view of a spin rinse dry (SRD) module.

Referring now to FIG. 2, a side view of spin-rinse-dry (SRD) module 272 in a stacked configuration is shown. Referring also to FIG. 3, an isometric view of spin-rinse-dry (SRD) module 272 is shown. Referring also to FIG. 4, a section view of spin-rinse dry-(SRD) module 272 is shown. As shown in FIG. 2, spin-rinse-dry (SRD) module 272 may be a stacked pair of process chambers 300, 302. The spin-rinse-dry (SRD) module 272 may be a stacked pair of process chambers 300, 302 that can edge bevel, etch, and/or rinse, and/or dry substrates operating in a parallel fashion in any suitable combination. Each process chamber 300, 302 may be fully independent and capable of operating on its own. Placing the chambers in the form of a vertical stack may save space and, for example, reduce die footprint of the substrate processing apparatus 200. Furthermore, stacking the process chambers 300, 302 may also locate the axis of wafer rotation, in each of the chambers at essentially the same horizontal (X, Y) coordinate relative to the robotic arm 276, thus, simplifying die robot servicing desired to load and unload process chambers 300, 302.

As shown in FIG. 3, an isometric view of process chamber 300 is provided. As former shown in FIG. 4, a section view of process chamber 300 is also provided. Process chamber 300 includes drive motor 310 which drives rotary chuck 312 through, a drive belt, wherein rotary chuck 312 is offset from drive motor 310. The rotary chuck 312 rotates on an axis of rotation via spindle 314. In alternate embodiments, any suitable drive motor may be used to rotate rotary chuck 312. As an example, the drive motor 310 may be directly coupled to spindle 314. Nozzle assembly 316 may have an array of nozzles, for example, for dispensing DI water on surface 318 of substrate 320 in a selectable dispense and/or motion pattern for nozzle assembly 316. In alternate embodiments, nozzle assembly 316 may be stationary, or optionally, not provided or otherwise.

Door 322 may be provided movable in direction 324 with a pneumatic cylinder, or other suitable method (door 322 is illustrated in a closed position in FIG. 3). Door 322 is provided to allow robotic arm 276 to load and unload substrates from process chamber 300 when the door 322 is in a lowered and open position, thus, allowing robotic arm 276 access an interior 326 of process chamber 300. When door 322 is in the closed position, door 322 prevents liquid from escaping the interior portion 326 of the process chamber 300, for example, during a clean or dry operation. Cover 330 is shown as a sloped or domed cover allowing liquid to drain beyond the outer edges of substrate 320 without dripping on the upper surface 318 of substrate 320, thus, preventing spots or residue on upper surface 318. While the cover 330 is shown to be conical, it may possess an alternative geometry, such as semi-spherical or semi-cylindrical.

Cover 330 may be thermoformed HDPE (high density polyethylene), or otherwise fabricated with slots 332 allowing the cover to be bolted to frame 334. The cover 330 may be designed with an angle 336 that is shown to be approximately 30 degrees. However, in alternative embodiments, angle 336 may be more or less. In the embodiment shown, cover 330 is separated from all critical mounting or alignment features and allows for trouble-shooting and inspection without affecting critical adjustments, such as the edge bevel etch (EBE) arm adjustment, wherein cover 330 may be removable without affecting operation or access to critical components of process chamber 300 during, setup, trouble-shooting, or test, or otherwise. Cover 330, door 322, or frame 334 may alternately include a viewing port or window (not shown).

Process chamber 300 is shown as including features for elimination of water drips onto upper surface 318 of substrate 320 from above, elimination of splashing, reduction of atmospheric oxygen by a factor often (10×) within chamber, an etch width tolerance of +/−0.3 mm (millimeter), an edge bevel etch (EBE) concentricity tolerance of +/−0.3 mm, no etchant drips after completion of etch process, and the ability to rotate an unclamped substrate from 0 to 200 rpm, or otherwise, with the modified modules to fit within, an existing system space allocation, or otherwise. Process chamber 300 may be provided with flexibility including the ability to modify process implementation through modular sub-components. These modular sub-components for example, may include nozzle configurations for edge bevel removal (EBR)-edge bevel etch (EBE) and rinse nozzles, and "Domed" Cover as a "Cover only" with no critical component mountings, or otherwise.

In the embodiment shown, cover 330 in combination with frame 334 and closed door 322 provide for fluid containment and collection wherein trough 340 is provided in frame 334 for drainage and removal of liquid. Furthermore, a labyrinth 342 may be provided, to prevent liquid from entering the region about spindle 314. Rotary chuck 312 may incorporate an edge grip feature, as opposed to a vacuum chuck or otherwise, to secure substrate 320 during rotation of rotary chuck 312. Spin-rinse-dry (SRD) module 272 may be provided with an edge pip feature as disclosed in U.S. patent application Ser. No. 13/356,252, filed on Jan. 23, 2012, and entitled "Substrate holder"; which is hereby incorporated by reference herein, in its entirety.

Edge-Bevel-Removal (EBR) may provide precise positioning of an etchant solution near the edge of a semiconductor wafer. In the embodiment shown and as will be described, the edge bevel removal hardware may be incorporated into spin-rinse-dryer (SRD) module 272, and edge bevel removal may be an initial process step, followed by spin rinsing and drying steps. When dispensing a small amount of fluid onto a surface, for example, using a dispense nozzle, three flow regimes may generally result. A first regime is edge beading, wherein surface tension forces dominate the behavior of the fluid. A second regime is viscous flow, wherein viscous forces predominate. And, a third regime is inertial, wherein inertial forces predominate and the fluid tends to spray. Viscous flow allows she fastest and most controllable etch rates and radial etch extent. High etch rates may occur when etchant fluid agitation assists in the transport of dissolved reacted species at the wafer surface. There are a variety of etchants, such as copper or other material etchants that may be used in the electronics industry. An exemplary chemistry may be a mixture of sulphuric acid, hydrogen peroxide, and deionized water (DIW).

The use of this chemistry for etching copper from printed circuit boards may be, for example, described by Jones et. al. in U.S. Pat. No. 3,293,093, which is hereby incorporated, by reference in its entirety, wherein Jones et al. may provide exemplary relative concentrations and etch rates. For example, the etch rate for a given chemistry may decrease rapidly as the concentration of dissolved material, such as copper, increases. Because of this effect, sufficient mixing of the etchant at the copper surface is desired. The maximum etch rate may occur when the etch reaction rate is determined by reaction kinetics at the surface, and not by diffusive transport of dissolved copper ions. Optimum etch rates may occur when the molar (weight) ratio of acid and peroxide is approximately 1:1, which, after solution densities are taken into account may also correspond to a 1:1 volumetric ratio. In alternate embodiments, other ratios may be provided.

Here, and by way of example, the maximum initial etch rate for a well-stirred 60° C. solution of 15% $H_2SO_4$, 15% $H_2O_2$, and 70% DIW, corresponding to 265 g/L of acid and 92 g/L of peroxide, may be 45 μm/min, and decreasing to 7.5 μm/min when the dissolved copper concentration is about 44 g/L. The use of various catalysts to stabilize peroxide in acid/peroxide copper etchant may be described in the literature. For example, the use of a selenium catalyst may be described in U.S. Pat. No. 4,138,593 to Allen which is hereby incorporated by reference in its entirety. Therein, Allen may use die same acid and peroxide concentrations as Jones et al., where a maximum etch rate of 68 μm/min at 54° C. is disclosed, which decreased to 7.5 μ/min with the addition of the catalyst. Furthermore, Allen also discloses an increase of etch speed of 2-3 for a catalyzed mixture when, the etchant is used as a spray, wherein proper mixing may achieve the highest rates.

Figure 5:
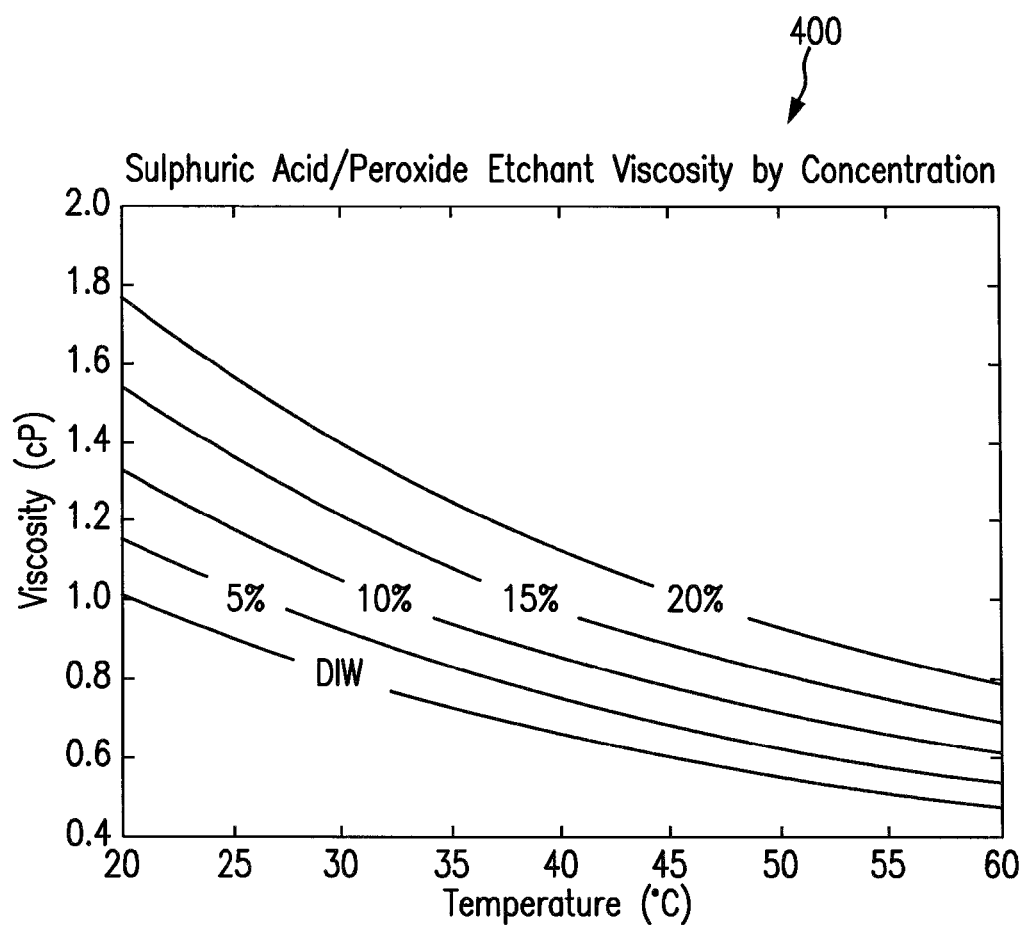
FIG. 5 shows an etchant viscosity versus temperature graph.

Referring now to FIG. 5, the relationship between an etchant solution viscosity and the temperature is provided in graph 400. In the exemplary embodiment shown, about 1:1 volumetric ratio of acid and peroxide may be assumed. Viscosity and surface tension are two liquid properties that may determine the viability or desirability of surface tension controlled etchant dispensing. In FIG. 5, a computer model of the viscosity of aqueous solutions of sulphuric acid and hydrogen peroxide was created and combined using the Refutas equation with the results shown. By way of example, for an etchant concentration of 15%, die mixture viscosity is approximately 50% greater than water, having a value of approximately 0.8 cP (centi-Poise) at about 60 degrees C. (Celsius).

The surface tension for water may be inversely proportional to temperature. For example, at about 60 degrees C., the surface tension of water is approximately 66 dyne/cm (centimeter), whereas at about 10 degrees C., the surface tension of water is approximately 74 dyne/cm. The surface tension for an etchant solution may be provided, wherein the surface tension for an etchant solution at about 60 degrees C. may be within 10% of value of 66 dyne/cm for pure water. For example, the surface tension for aqueous solutions of sulphuric acid versus temperature and concentration may be provided, wherein the surface tension may be within 10% of the value for pure water. Similarly, the surface tension for hydrogen peroxide solutions versus concentration and temperature may be provided, wherein the surface tension at a concentration of 15% may be within a few percent of the value for pure water. Here, the surface tension of an etchant solution may be within a few percent of the value for pure water.

Figure 6:
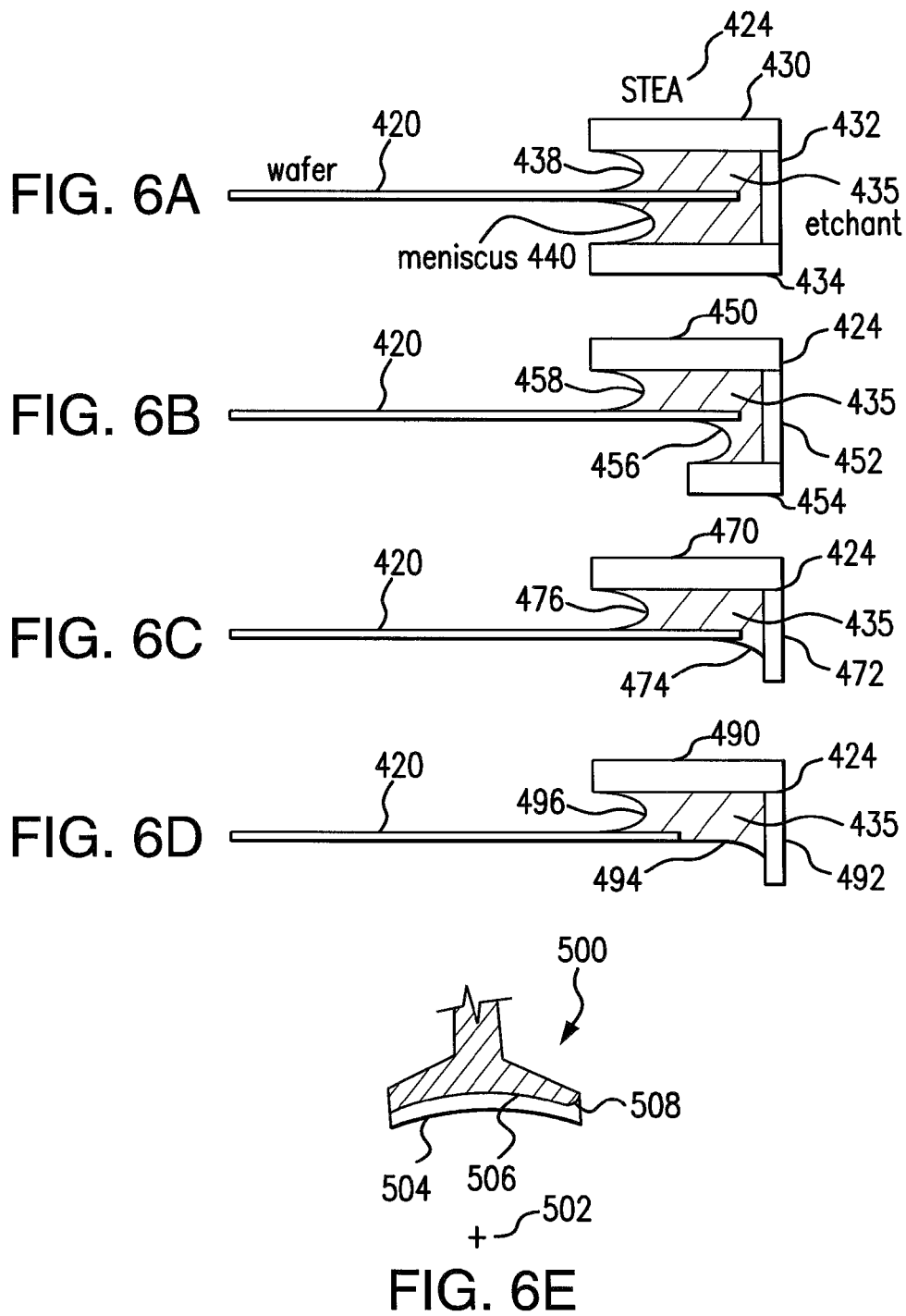
FIG. 6A shows a surface tension etch applicator cross section.
FIG. 6B shows a surface tension etch applicator cross section.
FIG. 6C shows a surface tension etch applicator cross section.
FIG. 6D shows a surface tension etch applicator cross section.
FIG. 6E shows a top section view of a surface tension etch applicator.

Referring now to FIG. 6A, a surface tension etch applicator 424 is shown in cross-section. In the embodiment shown, the surface tension etch applicator 424 includes wetted etching surface, such as at least a portion of an upper containment surface 430, an outer peripheral surface 432, and a lower containment, surface 434. In the embodiment shown, the upper containment surface 430 and the lower containment surface 434 include a radial dimension that extends a radial distance over and below a substrate surface of substrate 420 and an arcuate dimension that extends an angular distance along an edge of substrate 420 during dispensing of etchant 435.

Furthermore, the upper containment surface 430 and the lower containment surface 434 cover an angular area offset from the edge of substrate 420 that is substantially equivalent. Outer peripheral surface 432 is offset from, the edge of substrate 420 with the combination of upper containment surface 430, the outer peripheral surface 432, and the lower containment surface 434 forming a recess or cavity in which etchant 435 may be provided and retained by surface tension forces, thus, forming meniscus 438 and 440. In the embodiment shown, etchant 435 may be filled, at least partially, in advance with a meniscus forming between upper containment surface 430 and lower containment surface 434 absent substrate 420.

The radial position, of surface tension etch applicator 424 with respect to the centerline of substrate 420 may be selectable to provide a desired substrate etch coverage area at the edge of substrate 420. In the embodiment shown, etchant 435 is dispensed over an area on both upper and lower surfaces of substrate 420 that are approximately the same radial extent. In alternate embodiments, more or less area may be provided.

Referring also to FIG. 6B, an alternate embodiment for a surface tension etch applicator 424' is shown cross-section. In the embodiment shown, the surface tension etch applicator 424' includes wetted etching surface, such as at least a portion of an upper containment surface 450, an outer peripheral surface 452, and a lower containment surface 454. In the embodiment shown, the upper containment surface 450 and the lower containment surface 454 include a radial dimension that extends a first radial distance over a substrate surface of substrate 420 and a second radial distance over another substrate surface of substrate 420, and an arcuate dimension, that extends an angular distance along an edge of substrate 420 during dispensing of etchant 435.

Furthermore, the upper containment surface 450 and the lower containment surface 454 cover an angular area offset from the edge of substrate 420, wherein the upper containment surface 450 covers an area of substrate 420 that is larger than the lower containment surface 454. The outer peripheral surface 452 is offset from the edge of substrate 420 with the combination of the upper containment surface 450, the outer peripheral surface 452, and the lower containment surface 454 forming a recess (or cavity) in which etchant 435 may be provided and retained by surface tension, forces, thus, forming meniscus 458 and 456 which are offset as shown. In the embodiment shown, etchant 435 may be filled, at least partially, in advance with a meniscus forming between the upper containment surface 450 and the lower containment surface 454, absent substrate 420.

The radial position of surface tension, etch applicator 424" with respect to the centerline of substrate 420 may be selectable to provide a desired substrate etch coverage area at the edge of substrate 420. In the embodiment shown, etchant 435 is dispensed over an area on upper and lower surfaces of substrate 420 that are offset as shown with the coverage area on the upper surface larger than the coverage area on the lower surface. In alternate embodiments, more or less area may be provided on either surface.

Referring also to FIG. 6C an alternate embodiment for a surface tension etch applicator 424" is shown in cross-section. In the embodiment shown, the surface tension etch applicator 424' includes wetted etching surface, such as at least a portion of an upper containment surface 470 and an outer peripheral surface 472. In the embodiment shown, the upper containment surface 470 includes a radial dimension that extends a first radial distance over a substrate surface of substrate 420, and an arcuate dimension that extends an angular distance along an edge of substrate 420 during dispensing of etchant 435.

In the embodiment shown, the upper containment surface 470 covers an angular area offset from the edge of substrate 420. The outer peripheral surface 472 is offset from the outer edge of substrate 420 with the combination of upper containment surface 470 and outer peripheral surface 472 forming a recess (or cavity) in which etchant 435 may be provided and retained by surface tension forces, thus, forming meniscus 474 and 476 which cover a portion of the upper surface of the substrate 420 and the edge of substrate 420.

The radial position of surface tension etch applicator 424– with respect to the centering of substrate 420 may be selectable to provide a desired substrate etch coverage area at the edge of substrate 420. By way of example, in FIG. 6D, a surface tension etch applicator 424''' is shown having an upper containment surface 490 and an outer peripheral surface 491. The geometry is similar to that of the surface tension etch applicator 424" in FIG. 6C; however, it is offset radially outward from, the centerline of substrate 420.

In the embodiment shown, the upper containment-surface 490 covers an angular area offset from the edge of substrate 420 with the combination, of tire upper containment surface 470 and the outer peripheral surface 472 forming a recess (or cavity) in which etchant 433 may be provided and retained by surface tension forces, thus, forming meniscus 494 and 496 which cover a portion of the upper surface of the substrate 420 and the edge of substrate 420, the area being less than that shown in FIG. 6C.

The radial position of surface tension etch applicator 424''' with respect to the centerline of substrate 420 may be selectable to provide a desired substrate etch coverage area at die edge of substrate 420. With respect to FIGS. 6A-6D, although the containment and peripheral surfaces are shown as flat or radial surfaces, in alternate embodiments any suitable shape may be provided. For example, the peripheral surface may further be curved or otherwise blended into the upper and/or lower containment surfaces or otherwise.

Referring also to FIG. 6E, a top section view of a surface tension etch applicator 500 is shown, wherein substrate 420 rotates in a clockwise direction relative to centerline 502 in the view provided. In the embodiment shown, an etchant exit guide feature 508 is provided that is coupled directly to or arranged proximate with the surface tension etch applicator 500, and configured to guide etchant 435 from the wetted etching surface and away from substrate 420.

The etchant exit guide feature 508 may include a section through outer peripheral, surface 506 offset radially from the centerline and the edge of substrate 420, such as a flared portion relative to an inner edge 504 of the overlapping upper or lower containment surface. The main portion of outer peripheral surface 506 may be offset a constant distance from the edge of substrate 420. Alternately, the main portion of outer peripheral surface 506 may be offset a variable distance from die edge of substrate 420, for example, increasing, decreasing, tapered, with offset features, cuts, dispense or aspiration features, agitation features or otherwise.

Similarly, the upper and/or lower containment surfaces may be surfaces offset and parallel to the substrate or may alternately have variable surfaces as described with respect to the main portion of outer peripheral surface 506. The etchant exit guide feature 508 may be provided as a radius or chamfer or otherwise for the purpose of the accumulation of etchant 435 or otherwise. The etchant exit guide feature 508 may be provided to prevent edge bevel removal etchant exit droplet formation, wherein the trailing edge of the etchant exit guide feature 508 may be flared on one or more of the wetted surface(s) of the surface tension etch applicator (STEA) 500, such mar the meniscus breaks cleanly away from die substrate edge and/or surface(s) to provide a clean wafer exit with minimal or no droplet formation.

By way of example, a flared portion may be provided opposing and above an upper surface of the substrate, adjacent an edge of the substrate, and/or opposing and below a lower surface of the substrate, either alone or in combination. The embodiments shown in FIGS. 6A-6B, and as will be described below with respect to additional disclosed embodiments, provide exemplary interactions between the surface tension etch applicator (STEA) and the rotary chuck of a spin-rinse-dry (SRD) module. In alternate embodiments, one or more surface tension etch applicators (STEA) and Edge-Bevel-Removal (EBR) features may be used on a rotary check, or otherwise, on a module that is a part of or independent of a spin-rinse-dry (SRD) module.

For example, one or more surface tension etching applicators) (STEA) may be provided with a single rotary chuck having the same or different etchant or etch chemistry. Furthermore, for example, multiple Edge-Bevel-Removal (EBR) process modules may be provided. In the embodiments, etchant 435 may be dispensed at a flow rate, for example, between 10 and 200 ml/minute, or otherwise, forming a uniform bead around the edge of substrate 420 and/or within the surface tension etch, applicator (STEA). The rotation of the substrate may be substantially decoupled from other parameters, wherein substrate rotation tends to pull etchant from the recess (or cavity) formed by the wetted etching surface of the surface tension etch applicator (STEA) (towards the substrate surface) at the substrate-edge meniscus interface. As an example, a rotation rate of about 100 to 200 rpm, or otherwise, may be provided, wherein etching may take place primarily within the recess (or cavity) formed at the surface tension etching applicator (STEA) proximate the substrate edge-meniscus interface.

The Edge-Bevel-Removal (EBR) process, utilizing the features of the surface tension etch Applicator (STEA), primarily relies on etching within such region and not in a region outside of die surface tension etch applicator (STEA). Furthermore, within such region, thermal contact and mixing/agitation may be present at the etchant-substrate interface. In the disclosed embodiments, Edge-Bevel-Removal (EBR), which may also be described as Edge-Bevel-Etch (EBE), is a method for removing unwanted copper or other contamination from the edge region of a substrate after plating.

As described above, a surface tension etch applicator (STEA) which dispenses an etchant may be positioned proximate the substrate surface, and may be contoured to match the substrate edge profile. The surface tension etch applicator (STEA) may comprise a plate or a semi-closed region in which surface tension, forces contain the fluid, for example, overcoming gravity and shear forces to ensure that the etchant fluid remains in contact with both the surface tension etch applicator and the substrate etch area. Additionally, the surface tension etch applicator (STEA) may consist essentially of a plate or a semi-closed region in which surface tension forces contain the fluid, for example, overcoming gravity and shear forces to ensure that the etchant fluid remains in contact with both the surface tension etch applicator and the substrate etch area. Moreover, the surface tension etch applicator (STEA) may consist of a plate or a semi-closed region in which surface tension forces contain the fluid, for example, overcoming gravity and shear forces to ensure that the etchant fluid remains in contact with both the surface tension etch, applicator and the substrate etch area. The spacing between the wetted etching surface and a substrate surface may be set where surface tension forces dominate.

During dispense, shear forces due to the relative motion between the surface tension etch applicator and the rotating substrate cause enhanced fluid agitation, and therefore, efficient etching of material, such as residue, contaminant, or undesirable metal, on the substrate surface. The etchant dispensing portion of the surface tension etch applicator (STEA) may be heated to elevate the temperature of the captured etchant in the etch region, and thereby, provide a relatively higher etch rate as compared to other regions where the temperature of the etchant is not elevated and the etch rates are relatively lower.

The disclosed embodiments provide both more efficient etching as compared, for example, to spray-type etching and, for example, greater metal dissolution and less etchant consumption, while also providing more robust control of the position of the etched region relative to the substrate edge. The surface tension may be used to confine the etchant within a partially open recess or cavity. In the embodiments shown, the wetted surfaces may correspond to the wetted etching surface of the surface tension etch applicator (STEA) and the substrate. An exemplary material for the surface tension etch applicator (STEA) may be a nickel alloy, such as HASTELLOY®, or any suitable material, for example, that is chemically compatible with etchant solutions at elevated temperature.

An exemplary substrate surface may be initially copper and then transition to silicon as the copper is etched. In alternate embodiments, any suitable material or materials may be etched. The exposed metal(s) and silicon may be hydrophilic. The surface energy of exemplary wetted materials may be similar, for example, silicon having a surface energy of about 1.4 J/m$^2$ (Joules per meter squared), copper having a surface energy of about 2.0 J/m$^2$, and nickel having a surface energy of about 2.3 J/m$^2$. These exemplary values may lead to low wetting contact angles, for example, with values below 20°, or otherwise. By way of example, nickel, may have values between, about 7 to 25°. As shown in FIGS. 6A-6B, small contact angles between the menisci and fee wetted materials are shown. The surface tension etch applicator (STEA) may be provided to confine the etchant against the force of gravity by surface tension.

An equation for the menisci may be represented based on the Young-Laplace equation. A simplified solution may be provided, wherein the distances from or spacing between wetted surfaces may be less than about 2 mm for the surface tension to confine die etchant. As such, the spacing of the surface tension etch applicator (STEA) may be approximately 2 mm. In alternate embodiments, any suitable distance, spacing, or width, or otherwise may be provided.

In addition to gravity, a second force on the liquid may be the shear force of the rotating substrate. The pressure applied in the axial direction by the spinning substrate may be approximated as:

$$P = -\eta \frac{du}{dx}$$

where u is the velocity and η is the kinematic viscosity constant. If the flow within the surface tension etch applicator (STEA) is laminar, then a linear approximation for the velocity profile with height (is distance between wetted surfaces) is justified. The Reynolds number for the etchant flow is:

$$Re = \frac{\rho V D}{\mu},$$

wherein ρ is the fluid density, V is the tangential velocity of the substrate at the edge of the substrate, μ is the dynamic viscosity, and the appropriate dimension D is the applicator linear dimension, for example, approximately 10 cm, or otherwise.

By way of example, the Reynolds number is approximately 1500 at 100 rpm for a 300 mm diameter substrate, which may justify a laminar flow assumption, and the shear force may be approximately 30 dyne. The resulting torque of approximately 450 dyne-cm may insignificant for the drive motor; however, it is an unbalanced force, and if sufficiently large could cause substrate wobble. It may be maintained smaller than the sliding friction pad force, so as not to cause the wafer to wobble on the rotary chuck or slide with respect to the rotary chuck.

Figure 7:
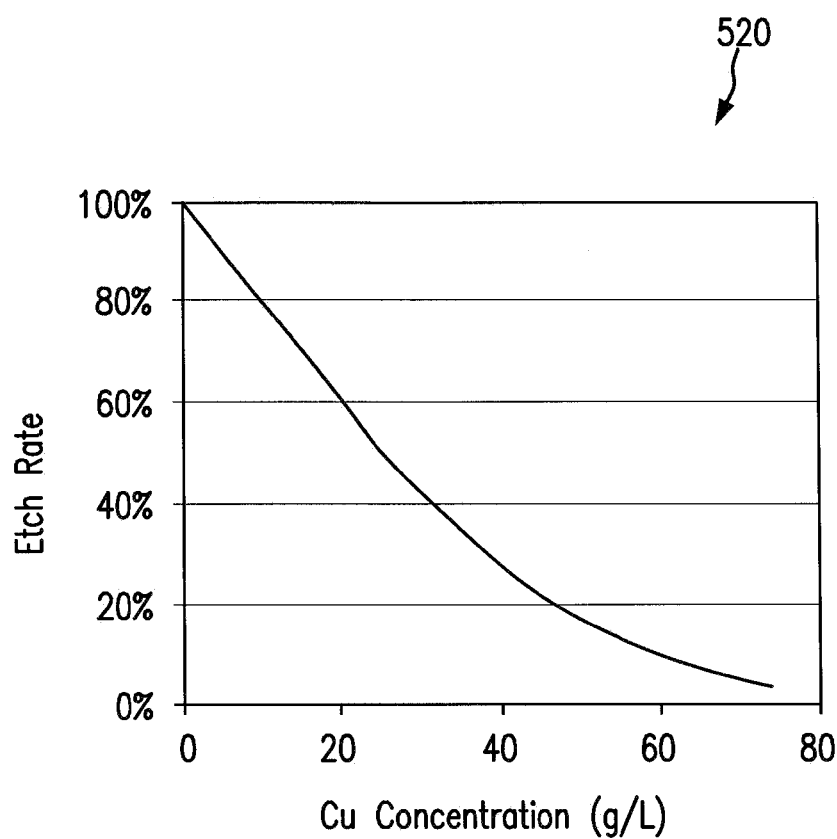
FIG. 7 shows an etch rate versus dissolved copper concentration graph.

Referring now to FIG. 7, a relationship between an etch rate and dissolved copper concentration is provided in graph 520, in the embodiment shown and as previously described, the etch rate drops as copper concentration increases. By way of example, the etch rate may drop by 40% when the copper concentration reaches approximately 20%. The etch rate may be expressed as: $R=R_0(T)f(c)W$, wherein $R_0$ represents the etch rate without dissolved copper ions. The temperature dependence of $R_0(T)$ may be assumed to the of the form of Arrhenius' equation. By way of example, at T=60° C., the maximum etch rate $R_0$=40 um/min.

The concentration dependence f(c) is illustrated in FIG. 7. The normalized width may represent the fraction of time that a point on the substrate wafer resides within the surface tension etch applicator (STEA) during each revolution, viz., W=L/(2πR), wherein L is the azimuthal length or arcuate dimension of the surface tension etch applicator. The motion of the substrate within the surface tension etch applicator (STEA) causes mixing. Using the Blasius solution for the boundary layer thickness, the mixing rate may be related to the velocity boundary layer thickness δ, where $\delta=5x/\sqrt{Re}$ and the boundary layer for diffusive processes is related to the velocity boundary layer by a proportionality constant.

For example, the temperature boundary layer may be $\delta_T=\Delta_T\delta$, where the proportionality constant $\Delta_T$ may be: $\Delta_T=1/Pr^{1/3}$, wherein the Prandtl number $Pr=c\mu/k=\mu/D\rho$ is 7 for water at room temperature. Since the diffusion coefficient for Cu ion transport is approximately $2\times10^{-5}$ cm²/s and about 100× smaller than the thermal diffusion constant for water ($1.4\times10^{-3}$ cm²/s), the expected proportion constant for Cu transport and the boundary layer thickness are only ⅕ of the thermal boundary layer. Thus for Cu ionic transport, the boundary layers may be approximately: $\delta_M=0.5x/\sqrt{Re}$.

Figure 8:
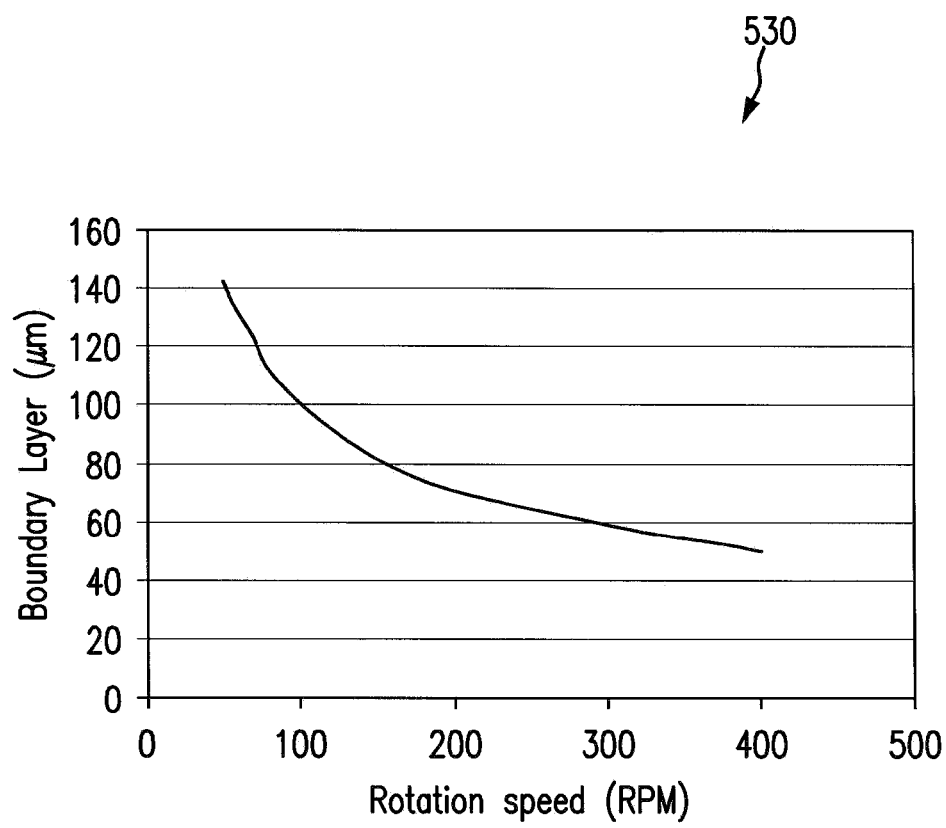
FIG. 8 shows a etchant boundary layer thickness versus rotation speed graph.

Referring also to FIG. 8, a relationship between an etchant boundary layer thickness and rotation rate is provided in graph 530. The etchant boundary layer thickness may include the thickness of any one of the momentum (velocity) boundary layer, the thermal (temperature) boundary layer, and the concentration boundary layer, and may generally refer to the momentum boundary layer thickness. One skilled in the art of fluid mechanics understands the relationship between the momentum boundary layer, the thermal boundary layer, and the concentration boundary layer, and in particular, recognizes that, the thickness of each boundary layer may vary depending on the relative values of diffusivity for each property (i.e., velocity/momentum (viscosity, μ), temperature (coefficient of thermal conductivity, k), and concentration (diffusion coefficient, D)) and the corresponding values for the Prandtl number (Pr), the Schmidt number (Sc), and the Lewis number (Ee). However, the relationship between each boundary layer thickness and the properties of the Edge-Bevel-Removal (EBR) process, such as the rotation rate or speed of the substrate, are expected to be similar. As an example, for the range of rotation rates to be used in so Edge Bevel Removal (EBR) processes, the boundary layer thickness (e.g., momentum, thermal, or concentration) may decrease with increasing rotation speed (or rate), as shown in FIG. 8. And, inspection of FIG. 8 would suggest that the boundary layer thickness (e.g., momentum, thermal, or concentration) for an etchant subjected to rotation in the range of rotation rates to be used in an Edge-Bevel-Removal process may be at least a factor of ten (>10×) smaller than the boundary layer thickness for an etchant not subjected to rotation. In a simple model, where the effect of local concentration on etch rate causes a reduction in copper flux J and etch rate as: $J=J_0(1-C_s^2/C_m^2)$, the etch rate scales with boundary layer thickness as $J=J_0[1-(\delta^2 J_0^2)/(C_m^2 D^2)]$. For the small boundary layers created by wafer rotation, the etch rate in the surface tension etch applicator (STEA) may be equal to the maximum (kinetic limited) rate $J_0$. As a result, the inventors suspect that the surface tension etch applicator (STEA) may provide mixing of the etchant solution. And, the etchant may be well-mixed for the range of rotation rates to be used in edge bevel removal (EBR) processes.

Figure 9:
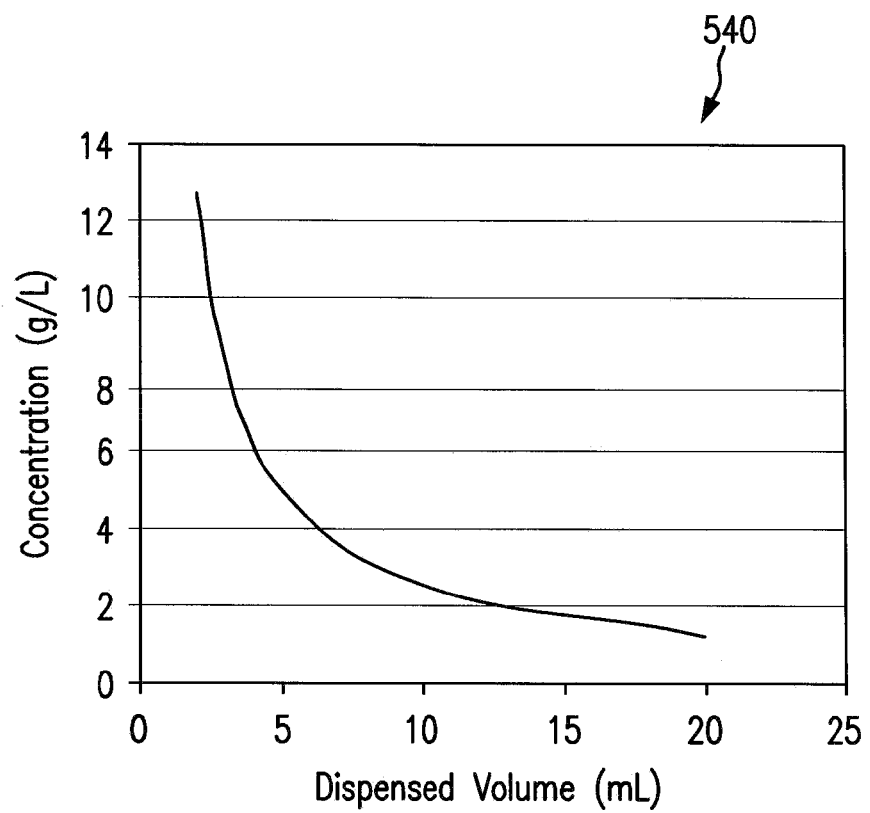
FIG. 9 shows an etchant copper concentration versos dispensed volume graph.

Referring now to FIG. 9, a relationship between au etchant copper concentration and dispensed volume is shown in graph 540. For etchant flow rate, it is desirable to maintain sufficiently low copper concentration inside the surface tension etch applicator (STEA) in order to meet a desired etch rate. Graph 540 in FIG. 9 shows by way of example, the etchant copper concentration versus dispensed volume per wafer, assuming 100% usage efficiency, 1 μm copper thickness, and 3 mm EBR width at the edge of the substrate. An exemplary etchant dispense volume per water may be provided to the approximately 10 mL, assuming for example, an etchant utilization of 25% and a maximum. Cu concentration of 10 g/L. This etchant dispense volume requires a pumping rate of 60 mL/min for a 10 s dispense time. A range of about 18 to 180 mL/min, for example, is adequate, to accommodate a dispense volume ranging between about 3 to 60 mL during a dispense time of about 10 sec.

Figure 10:
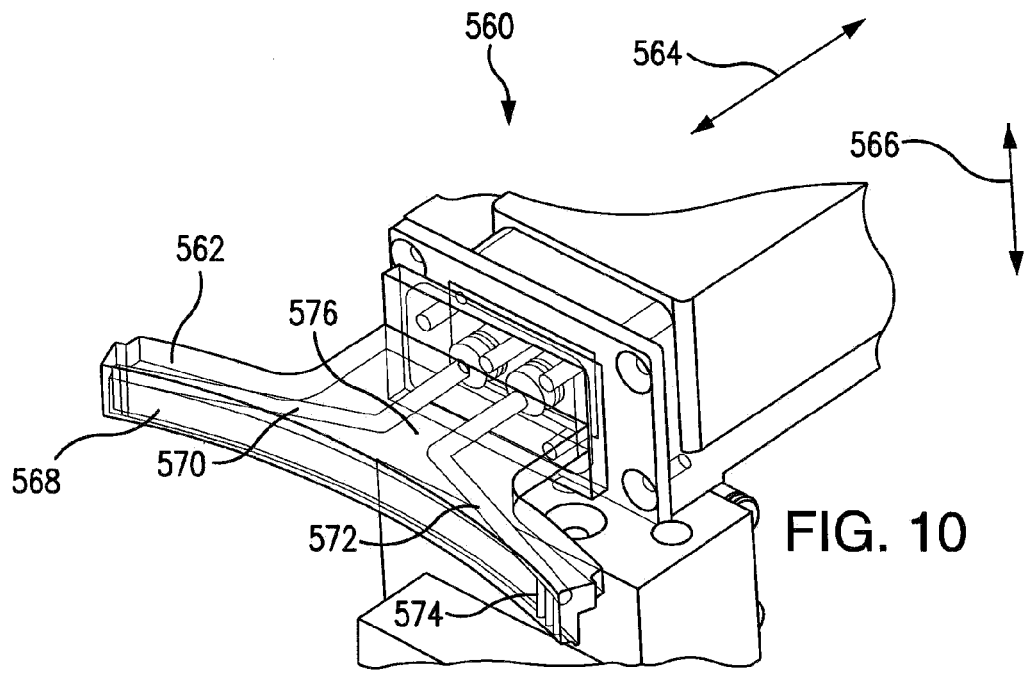
FIG. 10 shows a surface tension etch applicator.

Referring now to FIG. 10, a surface tension etch applicator 560 is shown, in the embodiment shown, surface tension etch applicator 560 is provided as an apparatus and method to etch metal from the edge bevel region of a substrate (or wafer) using surface tension control of an etchant solution as described above and as will be further described below. Surface tension etch applicator 560 has an etchant dispensing applicator 562 capable of containing etchant using surface tension forces. A recess 568 (or opening cavity, etc.) in etchant dispensing applicator 562, such as that shown in FIGS. 6C and 6D, is shown in the exemplary embodiment to accept or receive a substrate (or wafer). In alternate embodiments, the recess (or opening) in the etchant dispensing applicator may be constructed similar to die embodiments shown in FIGS. 6A and 6B, or my other suitable recess or opening may be provided to accept or receive a substrate (or wafer).

In the embodiment shown and as will be described below, the applicator radial, position 564 may be controlled relative to the substrate (or wafer) to control die radial etch extent or etch encroachment on the edge of the substrate (or wafer). Furthermore, the applicator vertical, position 566 of etchant dispensing applicator 562 may be controlled as will also be described in greater detail below. An applicator positioning system may be used that translates the surface tension etch applicator 560 in a radial direction relative to the substrate surface and controls the applicator radial position 564, and thus, the spacing between the wetted etching surface and the substrate surface. As indicated above, the applicator positioning system may control a distance the wetted etching surface extends over or below the substrate surface. Furthermore, the applicator positioning system may translate the surface tension etch applicator in a direction perpendicular to the substrate surface and may control a second spacing between the wetted etching surface and the substrate surface.

The spacing may include one or more distances measured between the substrate (or wafer) and the surface tension etch applicator (STEA) that defines or characterizes the geometric relationship between the surface(s) of the substrate (or wafer) being treated by the etchant and the wetted etching surfaces of the surface tension etch applicator (STEA) that come in close proximity to the treated substrate surface(s). As an example, a first, spacing may include the distance the upper containment surface of the surface tension etch applicator (STEA) extends over the upper surface of the substrate (or wafer) measured from the peripheral edge of the substrate. As another example, a second spacing may include the distance from the upper surface of the substrate (or wafer) to the upper containment surface of the surface tension etch applicator (STEA). As another example, a third spacing may include the distance the lower containment surface of the surface tension etch applicator (STEA) extends over the lower surface of the substrate (or wafer) measured from the peripheral edge of the substrate. As another example, a fourth spacing may include the distance from the lower surface of the substrate (or wafer) to the lower containment surface of the surface tension etch applicator (STEA). As yet another example, a fifth spacing may include the distance from the peripheral-edge of the substrate (or wafer) to the outer peripheral surface of the surface tension etch applicator (STEA). The spacing between the substrate and the wetted etching surfaces of the surface tension etch applicator (STEA), including the one or more distances described above, may be selected to retain the etchant there between using surface tension forces, and provide optimal conditions for etching the edge region of the substrate in an Edge-Bevel-Removal (EBR) process.

In one example of an embodiment, the spacing between the substrate and the wetted etching surfaces of die surface tension etch applicator (STEA), including the one or more distances described above, may be controlled using the applicator positioning system described above and a controller coupled thereto. As will be described in greater detail below, the applicator positioning system, may include actuators to effect translational and/or rotational movement, of the surface tension etch applicator (STEA) relative to the substrate.

The applicator positioning system and its controller may include one or more control boards, such as one or more PCBs (printed circuit boards) located on a module, such as a spin-rinse-dryer (SRD) module, for performing an Edge-Bevel-Removal (EBR) process, wherein the one or more control boards may include hardware and software to effect controlled movement of the surface tension etch applicator (STEA) in response to control signals carrying instructions from a computer control system. The computer control system may be located local to the module for performing the Edge-Bevel-Removal (EBR) process, or it may be located remote from the module. The computer control system and one or more control boards may be operated automatically according to a pre-programmed process sequence, or it may be operated manually by an operator.

According to another example, the computer control system and one or more control boards may include a processor and memory capable of any one of the following: (a) storing at least one predetermined spacing or set of spacing in a data library, (b) calculating a spacing depending upon process conditions/parameters, such as etchant composition/temperature, substrate rotation rate, etc., and/or process results, such as edge bevel removal, extent at the edge of the substrate, etch rate, etch selectivity, etc.; (c) determining the spacing from a map or variation of any one of die aforementioned process conditions/parameters; and (d) thereafter, controlling movement, of the surface tension etch applicator (STEA) to achieve the spacing via communication of instructions to the one or more control boards using one or more control signals. The controlled movement of the surface tension etch applicator (STEA) to effect changes in the spacing may be performed in response to data relating to spacing retrieved from the data library, calculated data based upon predetermined process conditions/parameters, data determined from process condition/parameter maps, data determined from best-known-methods (BKMs), or data determined from actual spacing measurements, or any combination of two or more thereof.

According to yet another example, the surface tension etch applicator (STEA) may include a proximity sensor to sense the proximity, e.g., the spacing or distance, between the substrate and the surface tension etch applicator (STEA). The proximity sensor may utilize electromagnetic (EM) radiation, such as an optical beam or IR (infrared) light, and thus, not require physical contact. Alternatively, the proximity sensor may utilize a feeler, and thus, require physical contact. In-situ measurement of the spacing may be utilized by the computer control system in a feed-back or feed-forward control scheme for controlling the spacing between the surface tension etch applicator (STEA) and the substrate.

With respect to FIGS. 6A-6E, an overhang may be provided on the top and/or the bottom of etchant dispensing applicator 562 (e.g., upper and lower containment surfaces) to determine fee relative extent of etching on die wetted top and bottom surfaces of the substrate (or wafer). An etchant dispensing portion 570 selectively dispenses etchant through one or more dispense orifice(s) 574, and an optional etchant aspirating portion 572 may collect etchant in conjunction with an etchant exit guide feature.

As will be described with respect to FIGS. 13-15, an etchant dispense and control system may be coupled to the surface tension etch applicator 560, and configured to control an etchant concentration, an etchant composition, or an etchant flow rate, or any combination of two or more thereof. Additionally, an applicator temperature control system may be coupled to the surface tension etch applicator 560, and configured to control a temperature of the etchant, or a temperature of the surface tension etch applicator 560, or a combination thereof. For example, the applicator temperature control system may include heater system(s) 576.

Heater system(s) 576, such as one or more resistance heater(s), heat exchanger(s), heated fluid circulation unit(s)/channels(s), or any suitable heater, may be provided on etchant dispensing applicator 562 to vary etchant temperature and provide heat directly to fee wetted etching surface and reaction zone. In the embodiment shown, etchant dispensing applicator 562 has dispense orifice(s) 574 to distribute the etchant uniformly or non-uniformly across the etchant dispensing applicator 562.

The etchant dispensing applicator 562 may include both etchant dispensing portion 570 and etchant aspirating portion 572. One example for the etchant dispensing applicator 562 may be an Active Etchant Purge (AEP) system. With an active etchant purge system, it is desirable to balance the etchant delivery and removal by pumping. By contrast, a Passive Etchant Purge (PEP) allows the etchant to exit either on the substrate (or wafer), or the etchant to be guided away from the substrate (or wafer). In the latter, an exemplary etchant exit guide feature was provided in FIG. 6E. With either the Active Etching Purge (AEP) or the Passive Etchant Purge (PEP) system, improved line width control may be realized, as the amount of etchant on the substrate (or wafer) may be determined primarily by surface tension effects, and not by etchant delivery and substrate rotation rates.

Figure 11:
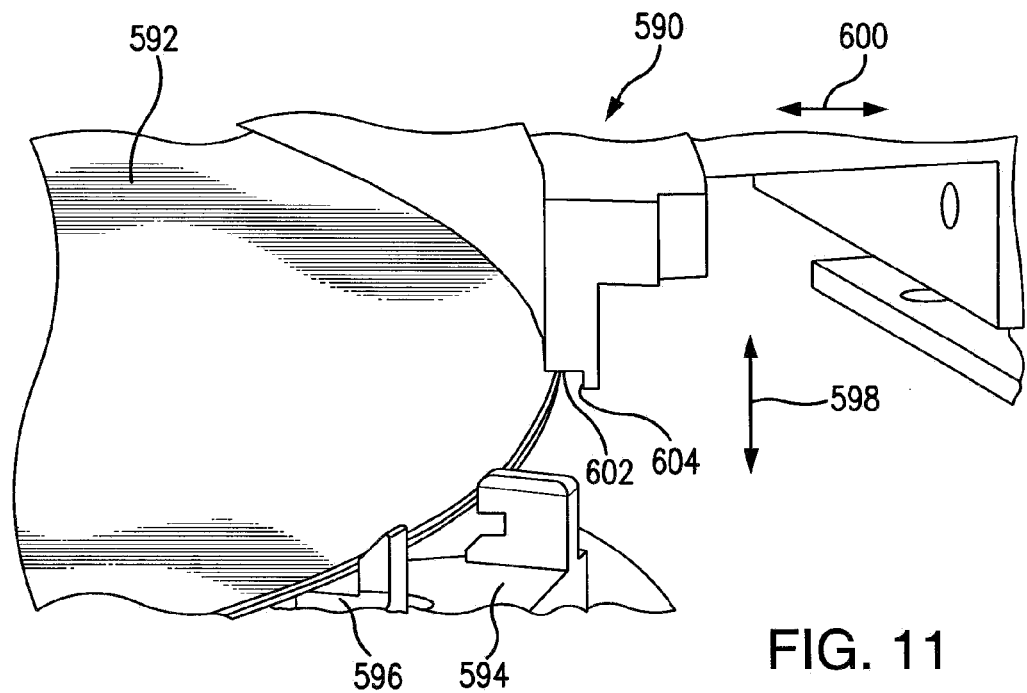
FIG. 11 shows a surface tension etch applicator in a spin rinse dryer.

Referring now to FIG. 11, a surface, tension etch applicator 590 in a spin-rinse-dryer is shown. In the embodiment shown, surface tension etch applicator 590 may have features as previously described, for example, the surface tension etch applicator 590 may have upper containment surface 602 and outer peripheral surface 604, and it may be radially movable in radial direction 600, as well as vertically movable in vertical direction 598, with respect to substrate 592. FIG. 11 shows the relationship between the surface tension etch applicator (STEA) 590 and the edge grip 594 mounted on a rotary chuck with a spin-rinse-dryer (SRD) module. Substrate supports 596, as will be described below, may further be provided in a manner so as to not interfere with surface tension etch applicator 590.

An Edge Bevel Removal (EBR) process may be performed at low rotation rates, for example, less than 200 rpm, or otherwise, with the edge grip 594 rotated as shown to avoid interference with the surface tension etch applicator (STEA) 590. The surface tension, etch applicator (STEA) 590 may be retracted before high speed, wish and dry steps, for example, at greater than 600 rpm, wherein the edge grip 394 may engage and center die edge of substrate 592.

Figure 12:
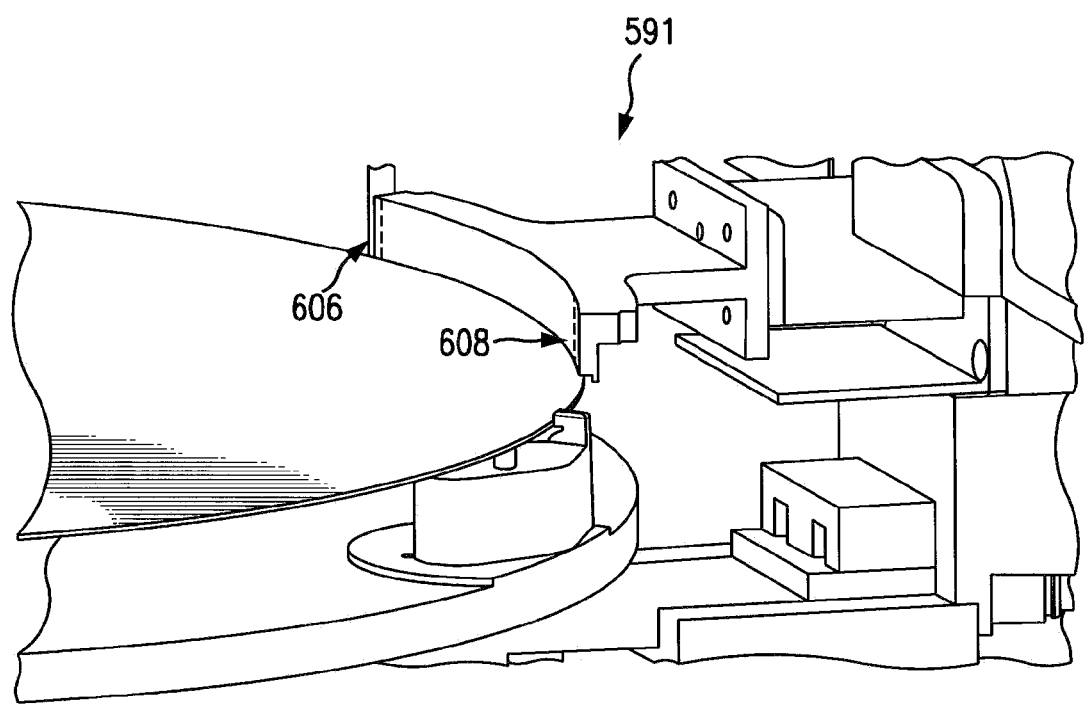
FIG. 12 shows a surface tension etch applicator in a spin rinse dryer.

Referring also to FIG. 12, a surface tension etch applicator (STEA) 591 in a spin-rinse-dryer (SRD) module is shown. As shown in FIG. 12, alignment features 606, 608 may be provided on the surface tension etch applicator (STEA) 391, wherein alignment features 606, 60S may be used to push the substrate to center-align the substrate prior to processing. Alignment features 606, 608 may be provided at an elevation above and offset from the wetted etching surface of the surface tension etch applicator 591, such that, upon placement of a substrate, the robot handling the substrate may engage alignment features 600, 608 at the edge of the substrate one or more instances to accurately move the substrate to a known position relative to the surface tension etch applicator 591. This procedure may be desired, for example, in cases when the desired line width centricity exceeds the robotic placement accuracy. Alignment features 606, 608 on the surface tension etch applicator (STEA) 591 may be used to ensure that the substrate is centered on the rotary chuck before processing.

Figure 13:
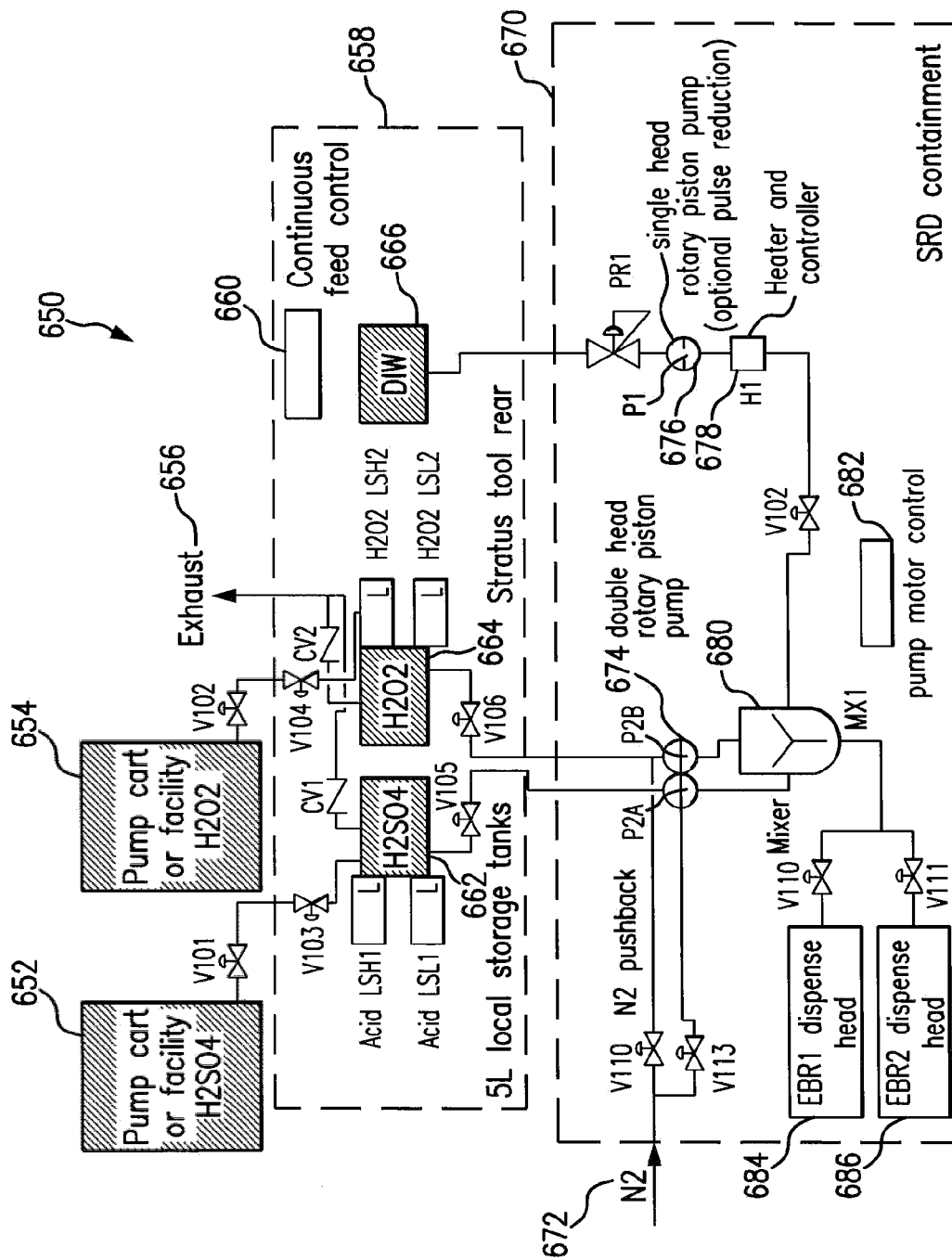
FIG. 13 shows a piping and instrumentation diagram.

Referring now to FIG. 13, a plumbing and instrumentation diagram 650 is shown. In the embodiment shown, one or more surface tension etch applicator(s) (STEA) 684, 686 may be part of a complete etchant delivery system with on-tool components (658, 670), and off-tool components (652, 654). The Edge Bevel Removal (EBR) process may utilize any of a number of potentially different delivery systems. For example, the etchant may be delivered under pressure or by metering pumps of various types. On-tool components (658, 670) may be divided into local component 670 within the spin-rinse-dryer (SRD) containment and remote component 658 located remotely. The local component 670 may include pneumatic valves, pumps 674, 676, a 3-way etchant mixing valve 680, a push-back system 673, heater and controller 678, controller 682, and the one or more surface tension, etch applicator (STEA) 684, 686 configured to dispense etchant.

Pumps may be of the rotary piston type. In alternate embodiments, any suitable pump may be used. The pump output may have an optional pulse reduction system which may maintain the etchant delivery at constant pressure by absorbing pressure pulses using a flexible membrane bladder.

The remote component 658 may include acid storage tank 662 (e.g., 5 L tank), peroxide storage tank 664 (e.g. 5 L), and DIW (de-ionized water) storage tank 666, and exhaust system 656 coupled to house exhaust. A control system 660 may be provided to allow an automated fill either from off-tool components (652, 654), such as pump carts, or fab facilities, based on the level of fluids measured bribe storage tanks (662, 664). A push-hack system 672 may use pressurized $N_2$ to move etchant from pump 674 in the spin-rinse-dryer (SRD) to the 5 L remote on-tool storage tanks (662, 664) for maintenance. Exhaust system 656 may be connected to acid exhaust, for example, to prevent over-pressurization during push back.

Figure 14:
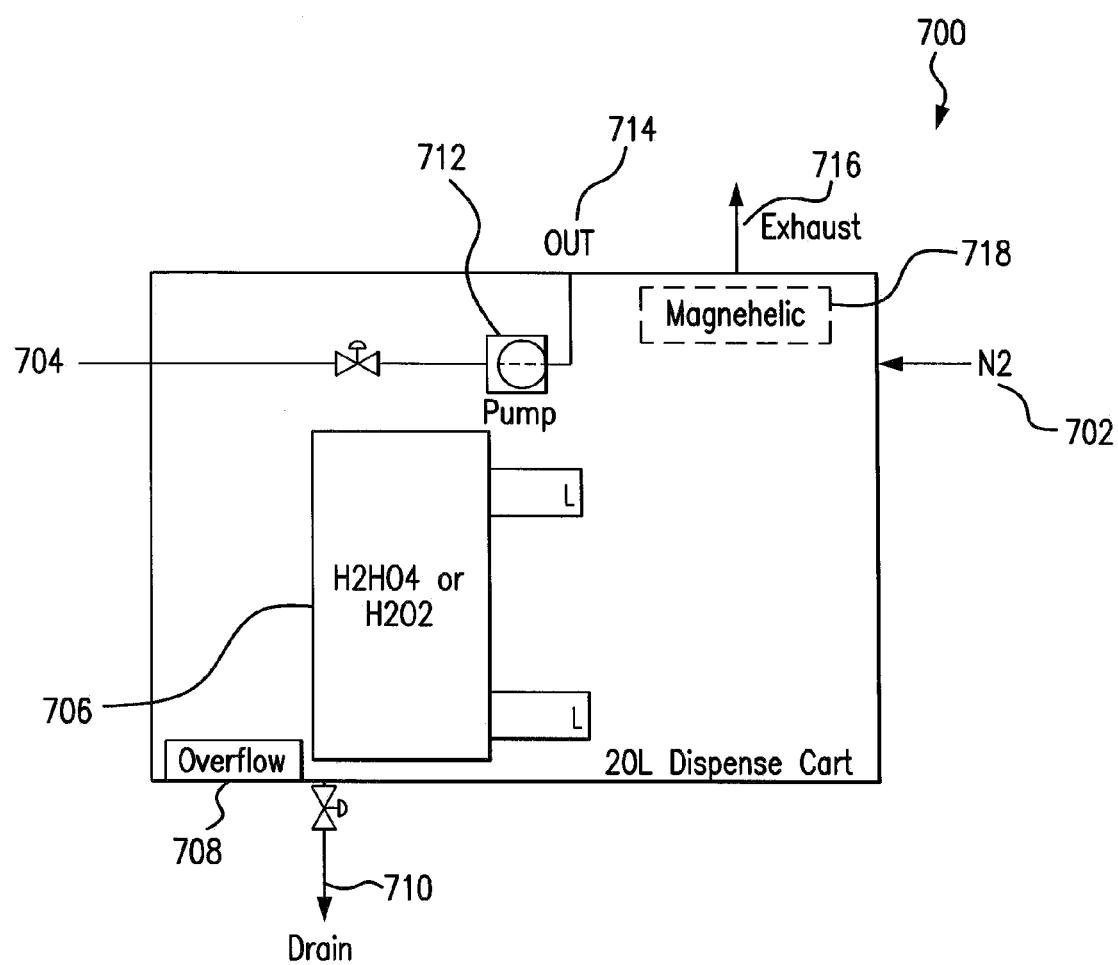
FIG. 14 shows a pump cart.

Referring now to FIG. 14, a pump cart 700 is shown. In the embodiment shown, pump cart 700 may be used in lien of or in conjunction with a supply from fab facilities. Pump cart 700 is shown with a (20 L) storage tank supplied by source 704 for filling (5 L) local tanks 706 for systems without direct facility supplies. Pump cart 700 has pump 712 and outlet 714 as the supply. An overflow 708 and drain 710 are farther provided and enclosed in an enclosure purged by nitrogen ($N_2$) gas line 702 and expelled by exhaust system 716 to house exhaust to maintain negative pressure within the enclosure. A pressure gage 718, such as a Magnehelic® pressure gage, may be provided to monitor nitrogen pressure within the enclosure relative to ambient.

Figure 15:
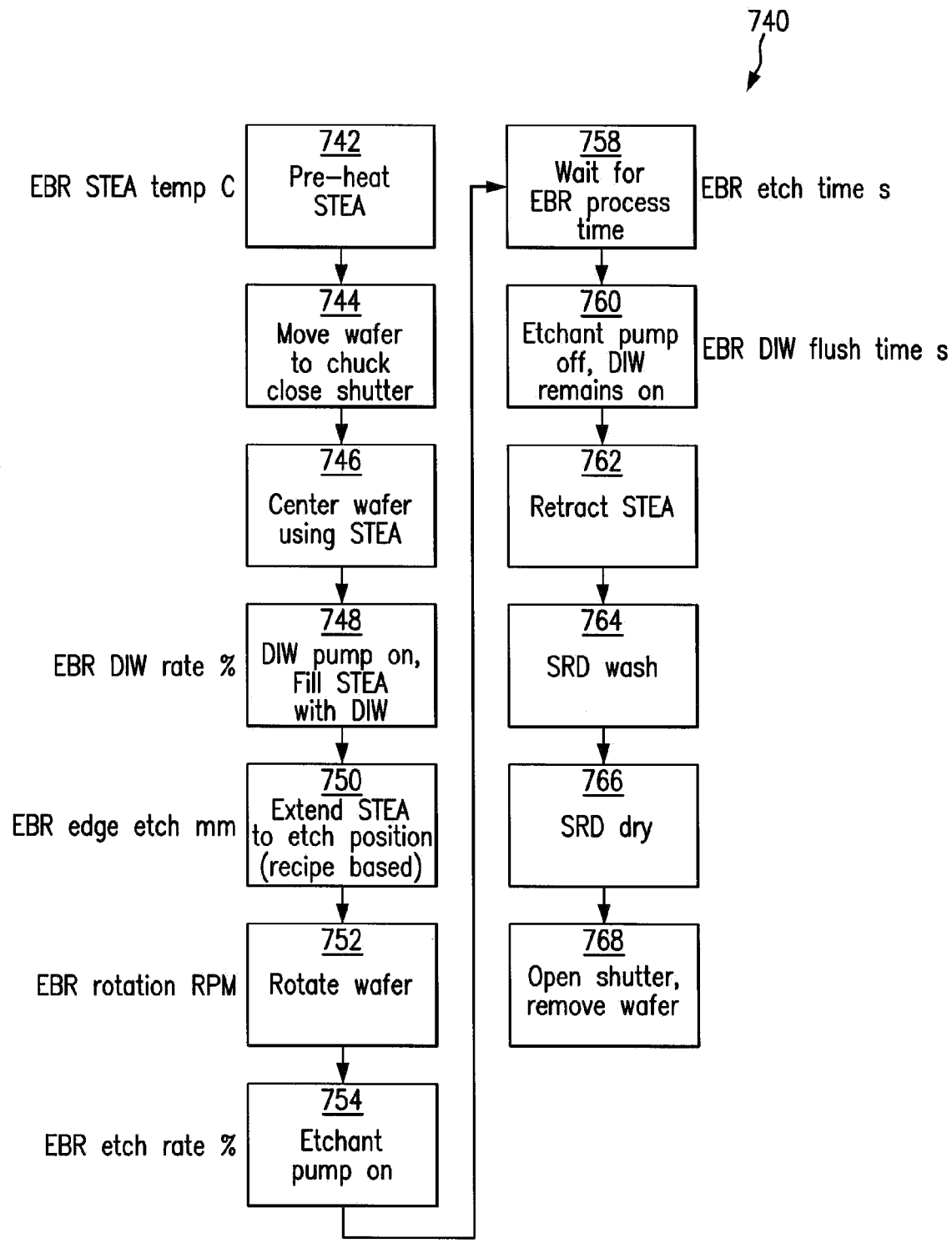
FIG. 15 shows a sequence of operation.

Referring now to FIG. 15, a sequence of operation 740 is shown. One possible sequence of operation for an Edge Bevel Removal (EBR) process is illustrated in FIG. 15, wherein more or less steps in varying order may alternately be provided. By way of example, an Edge Bevel Removal (EBR) process may include the following actions:

In 742, the surface tension etch applicator (STEA) is preheated to about 60° C.

In 744, a substrate is placed by the robotic arm on the edge grip of the rotary chuck, and the shutter is closed.

The surface tension etch applicator (STEA) may be positioned in an alignment position, which is located horizontally lower than for the Edge Bevel Removal (EBR) process.

In 746, the substrate may be precisely center aligned using the surface tension etch applicator (STEA).

In 748, the surface tension etch applicator (STEA) is supplied with a flow of DI water (DIW).

In 750, the surface tension etch applicator (STEA) is extended to an etch position, based on the recipe for the desired Edge Bevel Removal (EBR) process and radial etch width. During extension of the surface tension etch applicator (STEA), the spacing between the surface tension etch applicator (STEA) and the substrate may be controlled as described above.

In 752, the substrate is rotated.

In 754 and 758, the flow of etchant is initiated for the Edge Bevel Removal (EBR) process (745), for a process time (758).

In 760, the flow of etchant solution is terminated, while the flow of DIW may continue.

In 762, the surface tension etch applicator (STEA) is retracted.

In 764 and 766, the spin-rinse-dryer (SRD) module performs wash (764) and dry actions (766).

In 768, the shutter is opened and the substrate is removed.

In alternate sequences, more or less process steps in any suitable order may be provided. For example, the acid, peroxide, and DIW may be turned on simultaneously. By way of further example, for Active Etchant Purge (AEP) systems, a purging pump may also be turned on after 748, once the surface tension etch applicator (STEA) is filled with DIW or with etchant. By way of further example, DIW and/or SRD wash and dry steps may not be used. By way of further example, the etchant pump may remain on.

Figure 16:
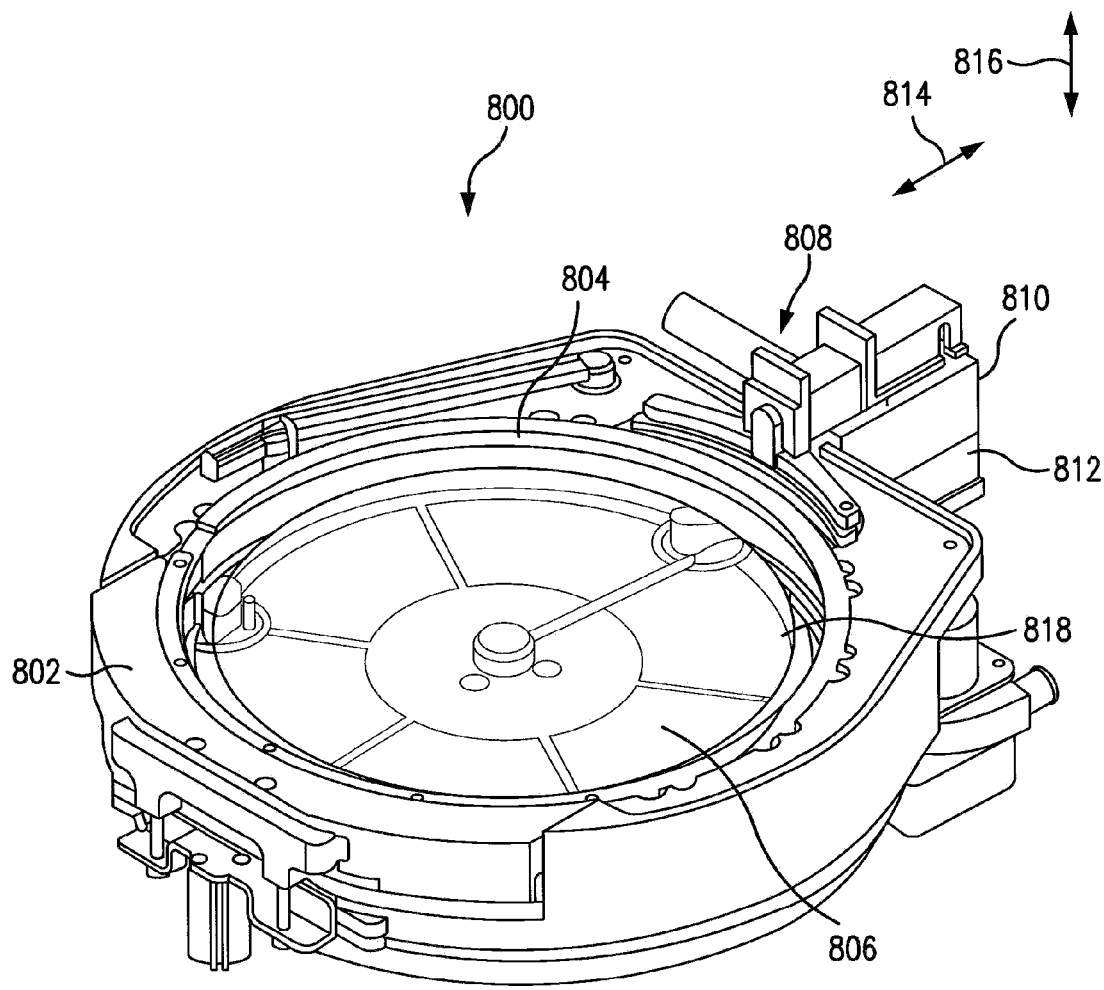
FIG. 16 shows an isometric view of a spin rinse dryer with a surface tension etch applicator.

Referring how to FIG. 16, an isometric view of a spin-rinse-dryer (SRD) 800 with a surface tension etch applicator 808. In FIG. 16, the surface tension etch applicator (STEA) 808 is shown, in a retracted state and being provided with selectable actuated radial, motion 814 and vertical motion 816, wherein radial motion 814 is provided by actuator 810 and vertical motion 816 is provided by actuator 812. As will be described, surface tension etch applicator (STEA) 808 is moveable between a retracted state as shown behind air diverter 804 to an extended state engaging substrate 818 on rotary chuck 806 to selectively-etch an annular region on the outer edge of substrate 818.

In the embodiment shown, air diverter 804 may be used to direct air, for example, with entrapped moisture droplets toward the exhaust plenum, located in the base of spin-rinse-dryer (SRD) 800. Air diverter 804 is shown axisymmetric, and may surround the rotary chuck 806, wherein the air diverter 804 may be split having a portion grounded to hie base of spin-rinse-dryer 800 and a portion that moves with robot transfer access gate 802. By directing the moisture so it may be exhausted, the air diverter 804 prevents water drops from accumulating on walls or surfaces of spin-rinse-dryer (SRD) 800. This air flow prevents accumulation of moisture, which might be blown or drip onto substrates in subsequent runs, cause water spot defect density.

Figure 17:
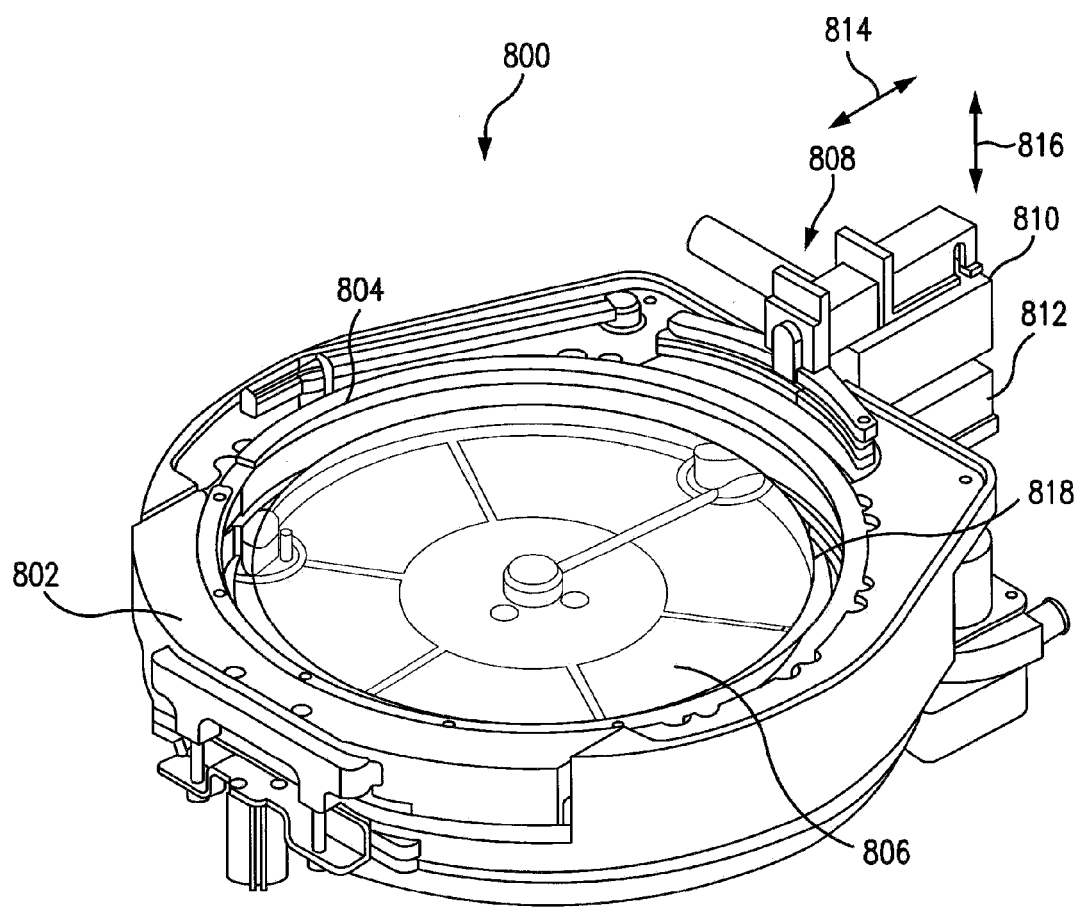
FIG. 17 shows an isomeric view of a spin rinse dryer with a surface tension etch applicator.

The air diverter 804 may be provided with the spin-rinse-dryer (SRD), independent of the edge bevel removal (EBR) capability. Referring also to FIG. 17, an isometric view of spin-rinse-dryer 800 with surface tension etch applicator 808 is shown in a different configuration. In FIG. 17, the surface tension etch applicator (STEA) 808 is shown raised, for example, 15 mm by actuator 812 to clear the air diverter 804.

Figure 18:
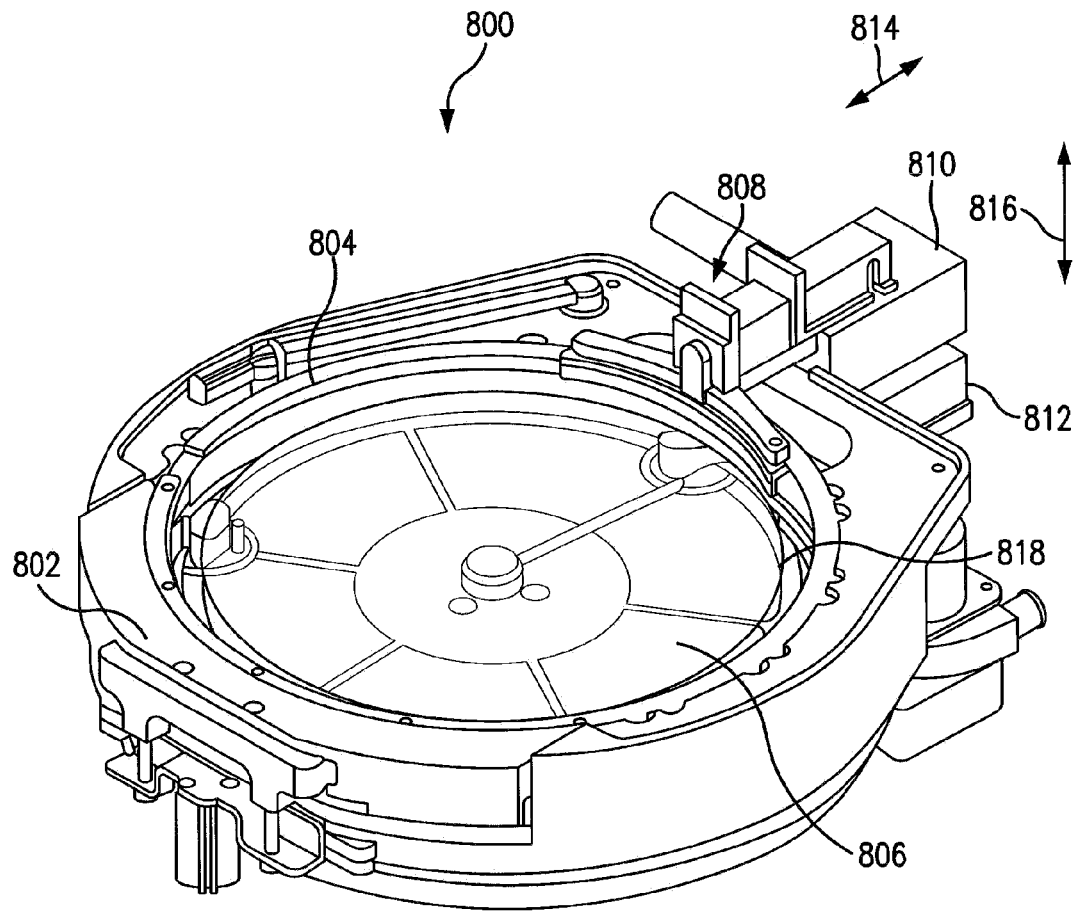
FIG. 18 shows an isometric view of a spin rinse dryer with a surface tension etch, applicator.

Referring also to FIG. 18, an isometric view of the spin-rinse-dryer 800 with surface tension etch applicator 808 is shown in another different configuration. In FIG. 18, the surface tension etch applicator 808 (STEA) is shown extended, for example, by actuator 810 beyond, the air diverter 804.

Figure 19:
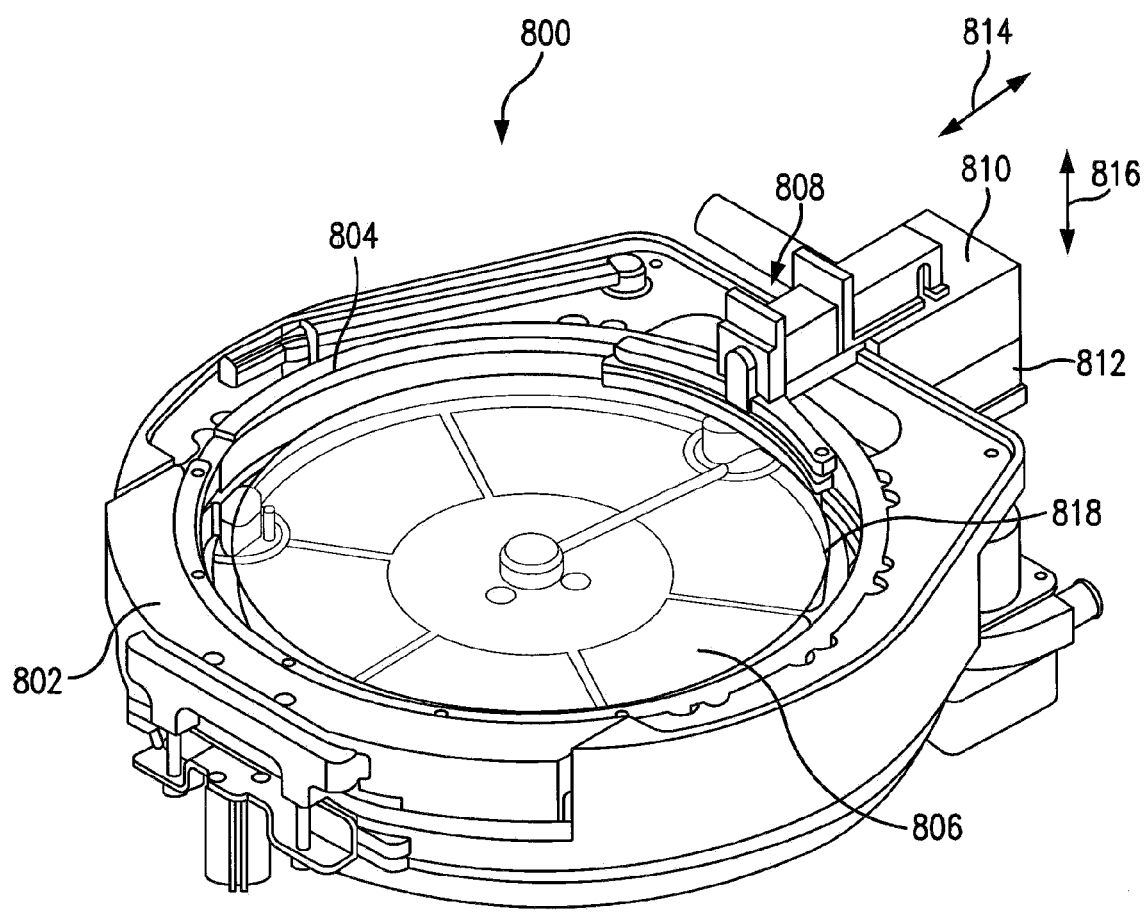
FIG. 19 shows an isometric view of a spin rinse dryer with a surface tension etch applicator.

Referring now to FIG. 19, an isometric view of the spin-rinse-dryer 800 with, surface tension etch applicator 80S is shown in yet another different configuration. In FIG. 19, the surface tension etch applicator (STEA) 804 is shown, in the etch position and lowered by actuator 812.

Figure 20:
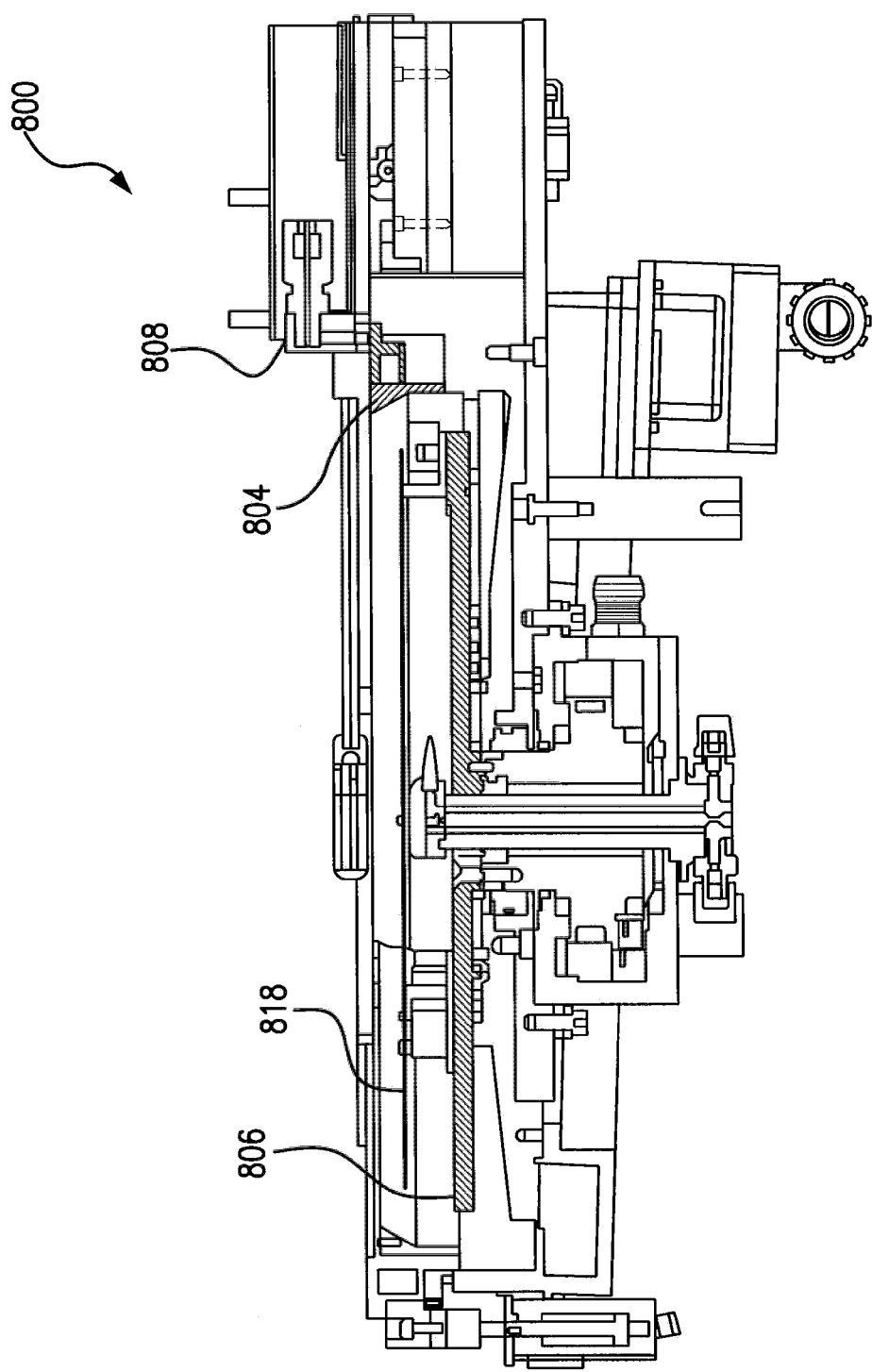
FIG. 20 shows a section view of a spin rinse dryer with a surface tension etch applicator.
Figure 21:
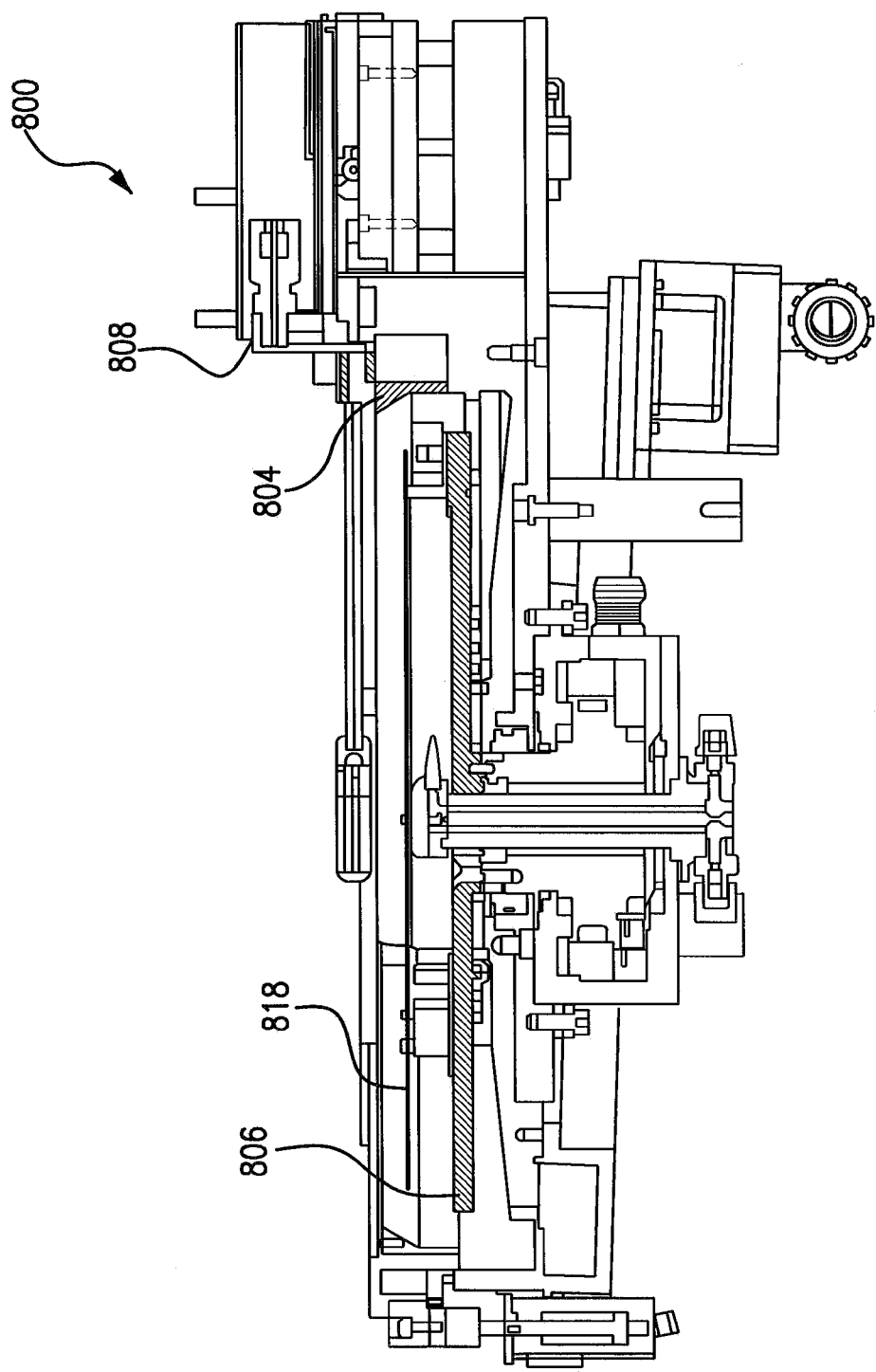
FIG. 21 shows a section view of a spin rinse dryer with a surface tension etch applicator.
Figure 22:
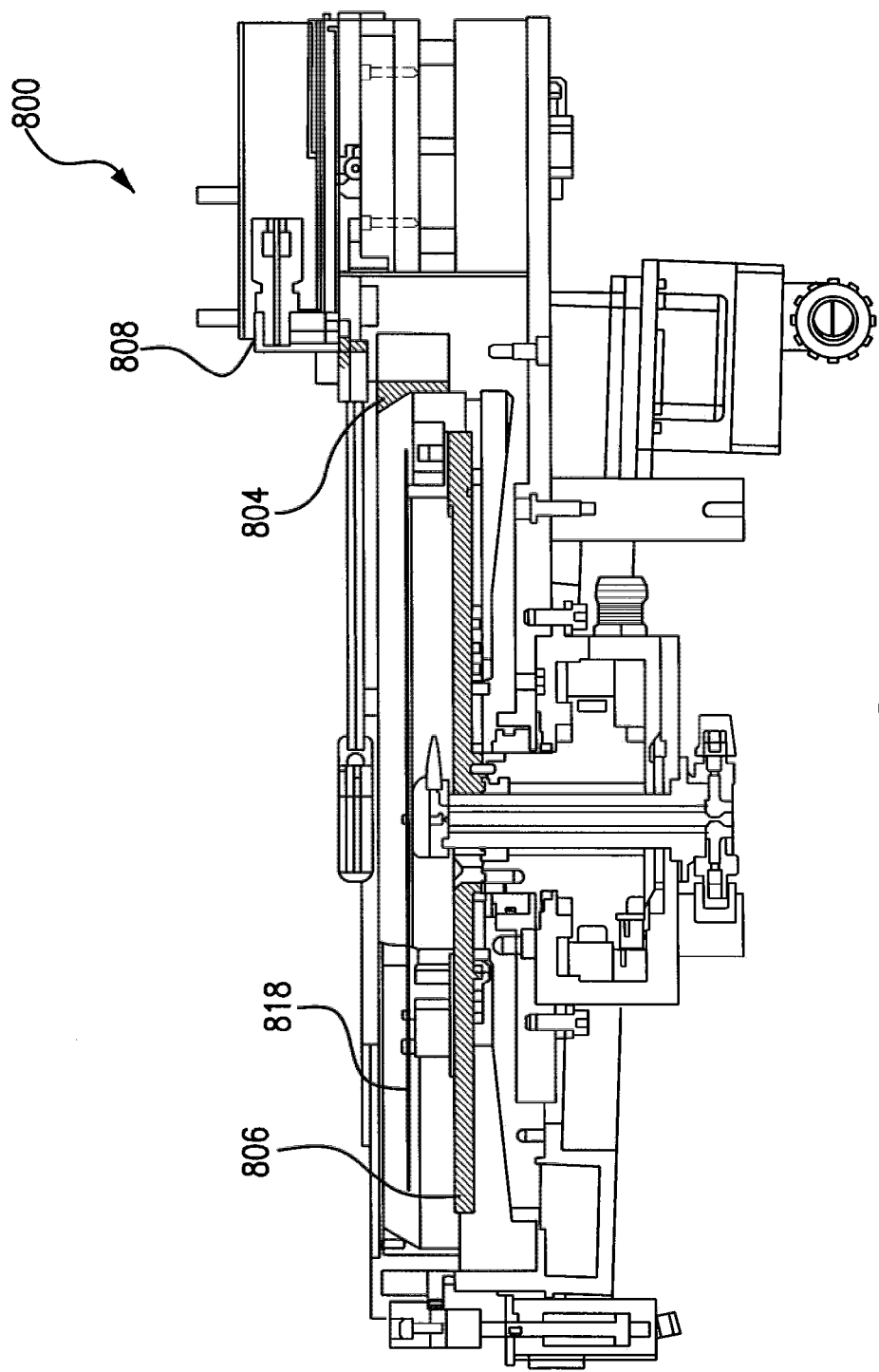
FIG. 22 shows a section view of a spin rinse dryer with a surface tension etch applicator.
Figure 23:
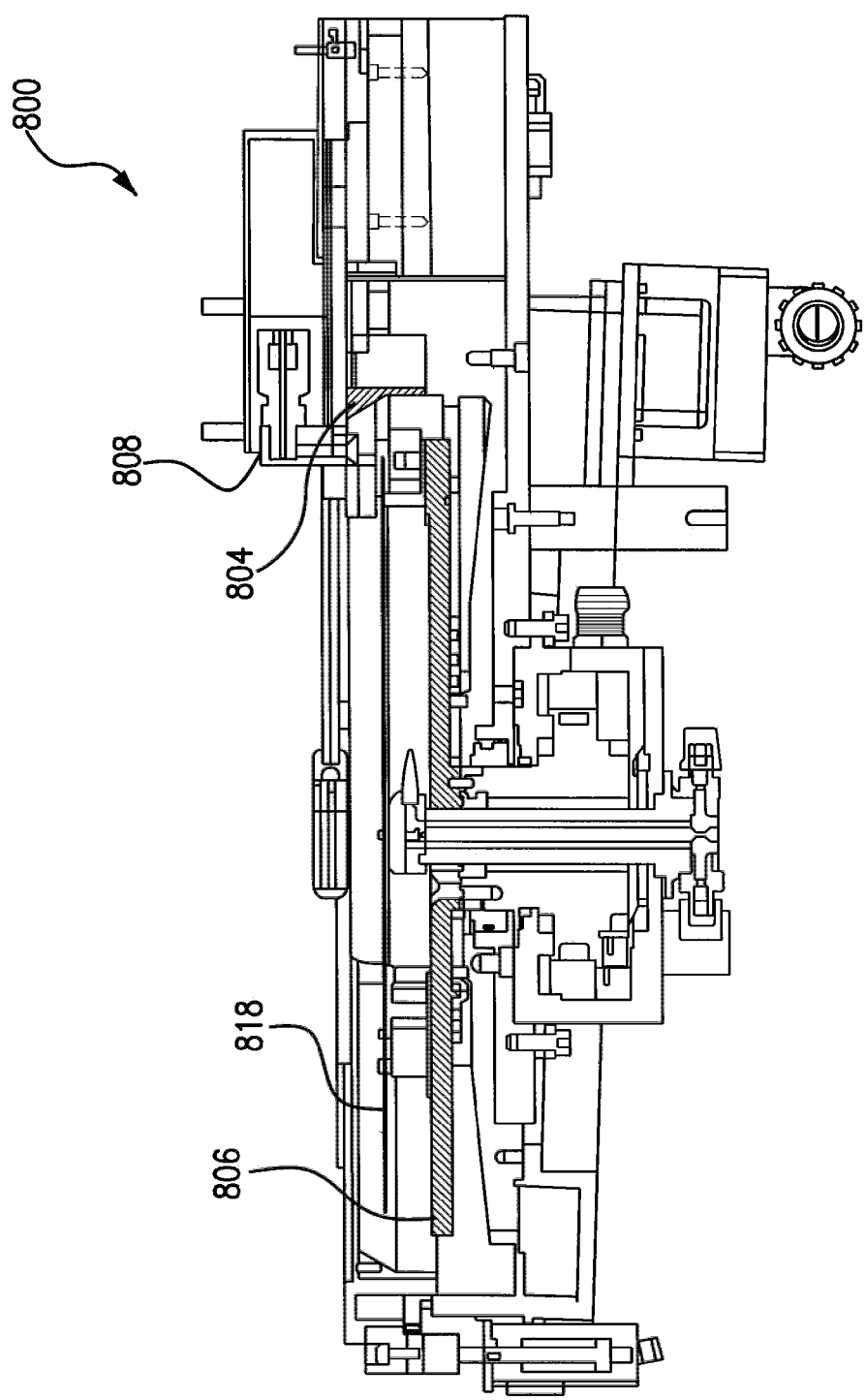
FIG. 23 shows a section view of a spin rinse dryer with a surface tension etch applicator.

Referring also to FIG. 20, a section view of the spin-rinse-dryer 800 with surface tension etch applicator 808 is shown. In FIG. 20, the surface tension etch applicator (STEA) 808 is shown retracted. Referring also to FIG. 21, a section view of the spin-rinse-dryer 800 with surface tension etch applicator 808 is shown. In FIG. 21, the surface tension etch applicator (STEA) 808 is shown raised 15 mm. Referring also to FIG. 22, a section view of the spin-rinse-dryer 800 with surface tension etch applicator 808 is shown. In FIG. 22, the surface tension etch applicator (STEA) 808 is shown extended. Referring also to FIG. 23, a section view of the spin-rinse-dryer 800 with surface tension etch applicator 808 is shown. In FIG. 23, the surface tension etch applicator (STEA) 808 is shown in an etching position.

Figure 24:
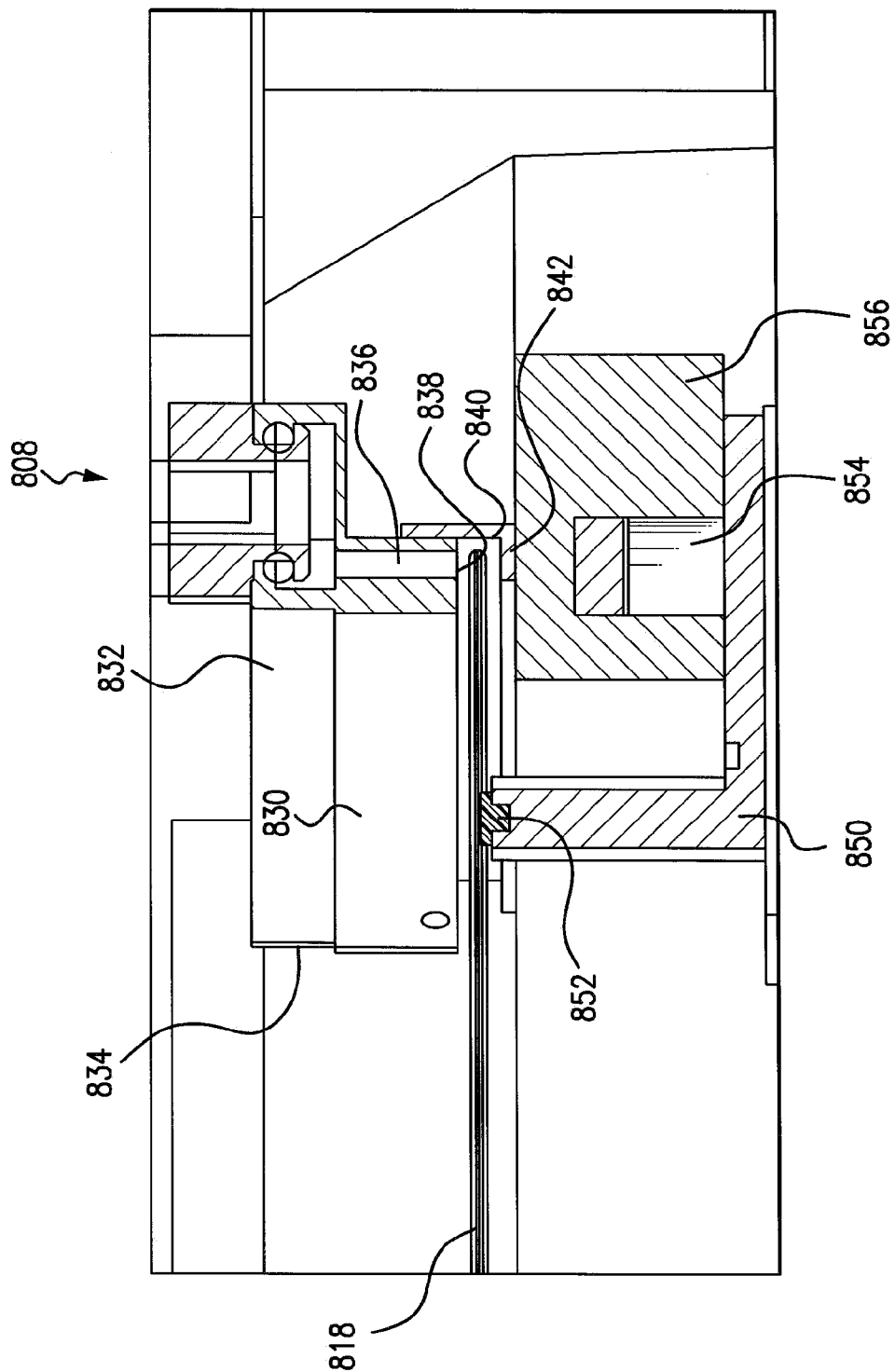
FIG. 24 shows a section view of a surface tension etch applicator.
Figure 25:
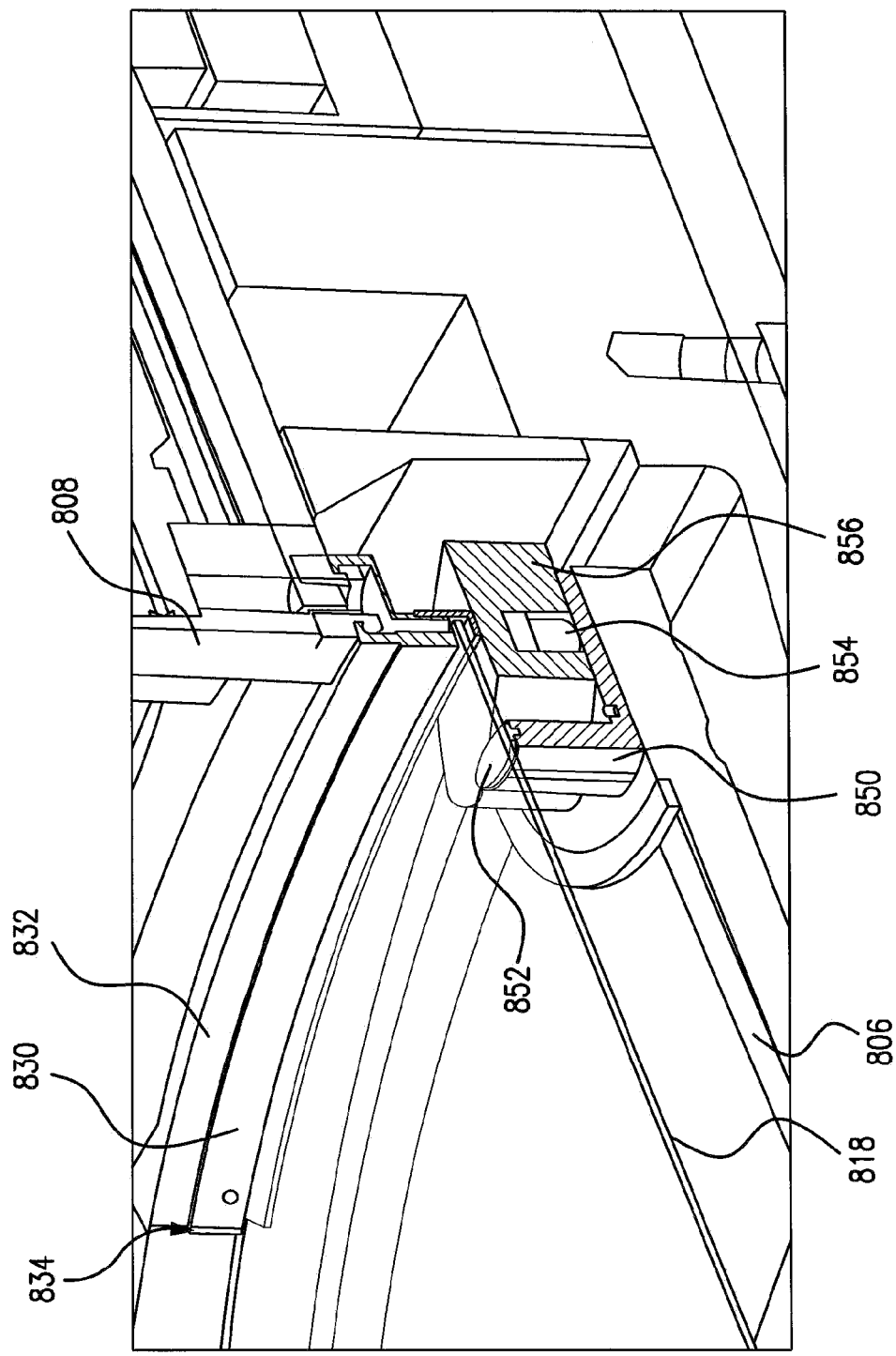
FIG. 25 shows an isometric section view of a spin rinse dryer with a surface tension etch applicator.

Referring now to FIG. 24, an exploded section view of the spin-rinse-dryer 800 with surface tension etch applicator 808 is shown. In FIG. 24, the surface tension etch applicator (STEA) 808 is shown in an etching position. Referring also to FIG. 25, an isometric section view of the spin-rinse-dryer 800 with the surface tension etch applicator 808 is shown.

In FIG. 25, a surface tension etch applicator (STEA) 808 is shown in an etching position. In the embodiment shown, substrate support structure 850 is shown on a rotary chuck 80b, wherein substrate support, structure 850 has a substrate support pad 852 and an edge grip support post 854. Substrate support pad 852 may be made from a thermoplastic elastomer, such as Santoprene® commercially available from Exxon Mobil, as a material to support substrate 818 with a high coefficient of friction so as to prevent slippage during an edge bevel etch process. In alternate embodiments, other suitable materials may be used.

In the embodiment shown, the substrate support structure 850 with edge grip support post 854 is shown rotated away from the wetted area being etched at the edge of substrate 818 so as to prevent interference between surface tension etch applicator 808 and the substrate support structure 850 and edge grip support post 854. Further, the surface tension etch applicator (STEA) 808 is shown clearing the air diverter 804 in an etching location and selective etching position. A rotatable edge grip portion 856 pivots on support post 854, and is adapted to engage the edge of substrate 818 daring a spin-rinse-dry operation, for example, above 600 rpm, but not during an edge bevel etch operation, for example, below 200 rpm.

In this manner, the edge bevel etch operation may be conducted independent of a spin-rinse-dry operation, wherein the surface tension etch applicator 808 is retracted to an opposing side of air diverter 804 as previously described. In the embodiment shown, surface tension etch applicator 808 has upper portion 832 and lower portion 830. Upper portion 832 acts as a manifold to supply etchant from supply port 860 through etchant flow holes 836 in lower portion 830. Upper portion 832 is shown having a relief cut and forming two opposing wafer alignment features 834 as previously described. Lower portion 830 has wetted etching surface 838 opposing the top surface, of substrate 818, wetted etching surface 840 opposing die edge of substrate 818 and wetted etching surface 842 opposing the lower surface of substrate 818.

Figure 26:
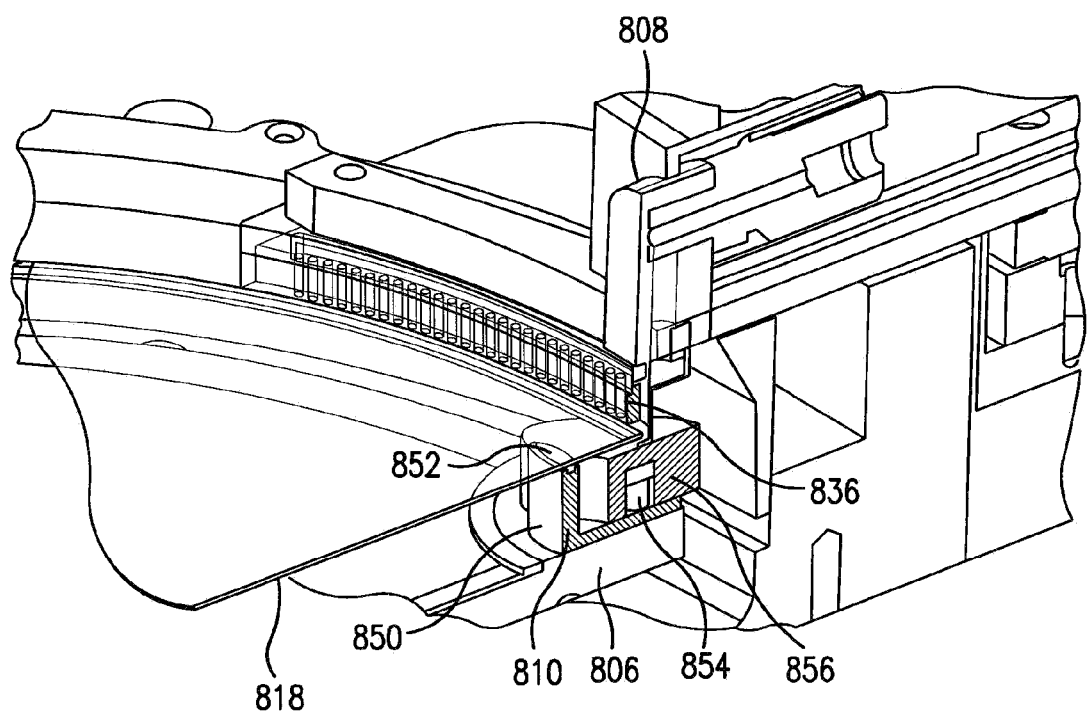
FIG. 26 shows an isometric section view of a spin rinse dryer with a surface tension etch applicator.

In alternate embodiments, any suitable combination of wetted, etching surface(s) may be used and as previously described. Referring also to FIG. 26, an isometric section view of the spin-rinse-dryer 800 with surface tension etch applicator 808 is shown. In FIG. 26, a side section isometric close-up of surface tension etch applicator (STEA) 808 is shown. The etchant flow holes 836 in surface tension etch applicator (STEA) 808 at a rear surface of the surface tension etch applicator (STEA) 808 are shown. In the embodiment shown, etchant flow through multiple etchant flow holes 836 may create a uniform meniscus in the surface tension etch applicator (STEA) 808 at the edge of substrate 818, as previously described. In alternate embodiments, more or less etchant flow holes may be provided in different or similar locations.

Figure 27:
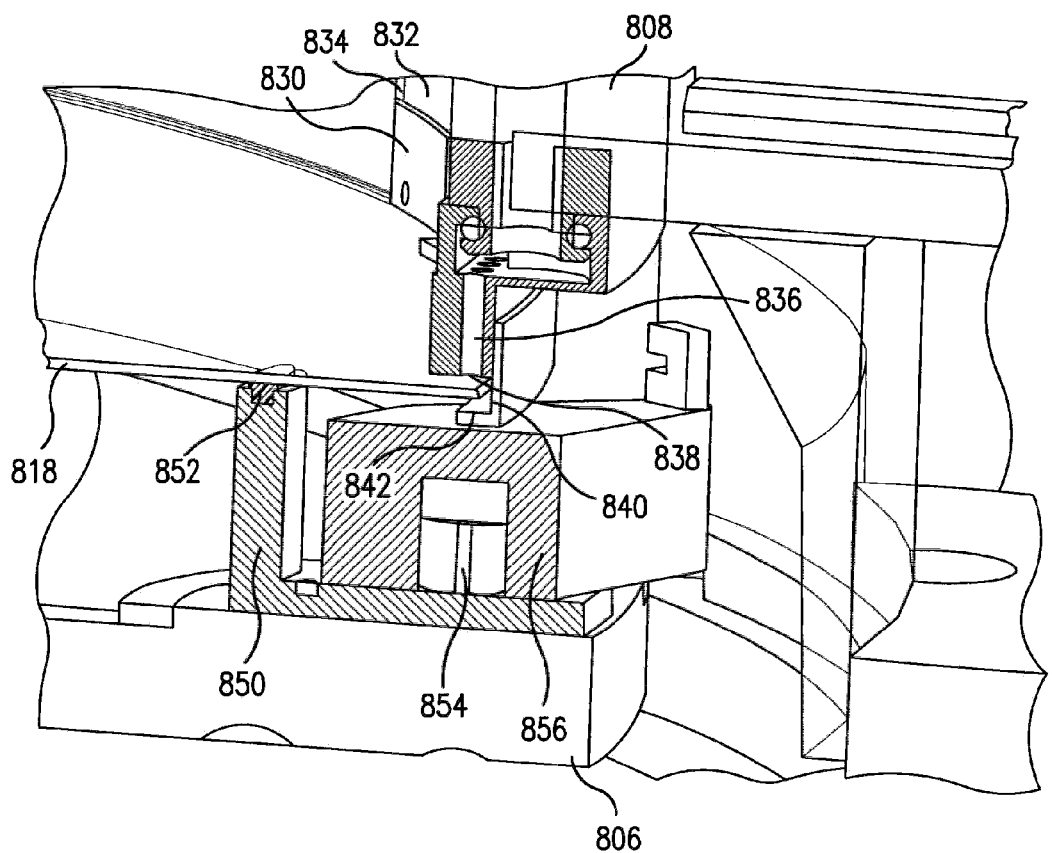
FIG. 27 shows an isometric section view of a spin rinse dryer with a surface tension etch applicator.
Figure 28:
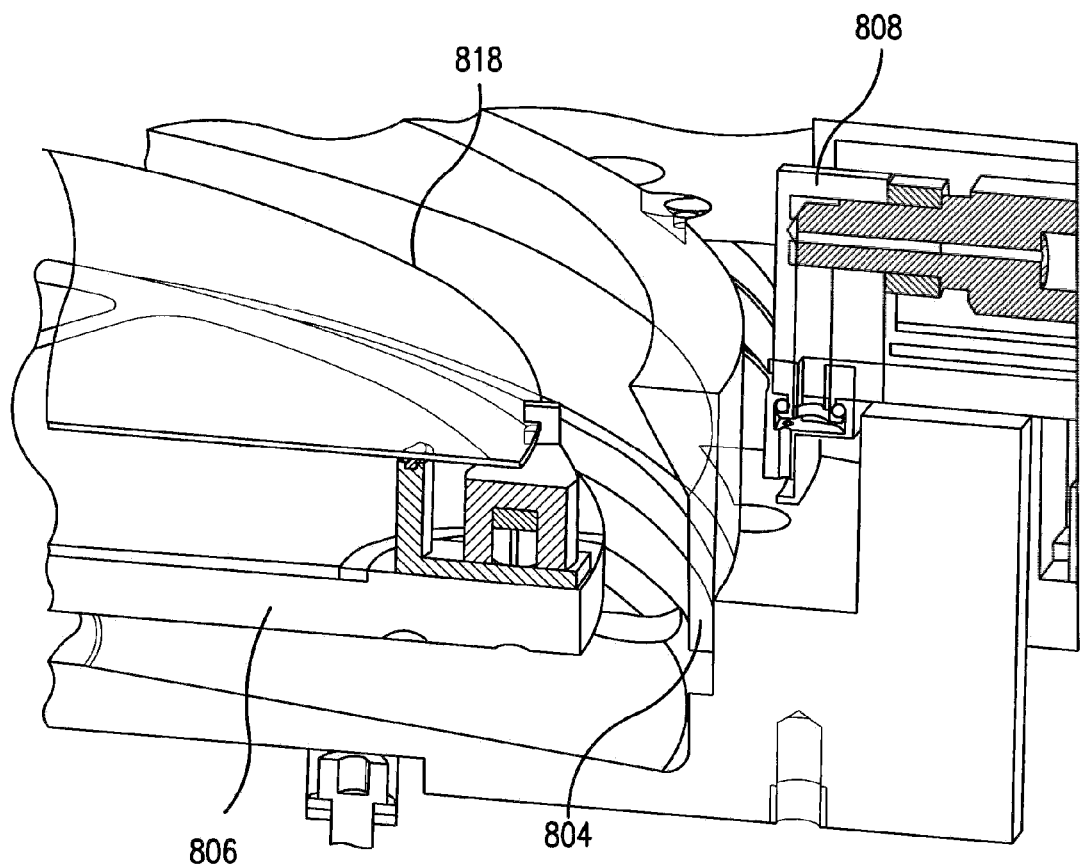
FIG. 28 shows an isometric section view of a spin rinse dryer with a surface tension etch applicator.

Referring also to FIG. 27, an isometric section view of the spin-rinse-dryer 800 with surface tension etch applicator 808 is shown. In FIG. 27, a side section isometric close-up is shown showing an edge grip position during Edge Bevel Removal (EBR). In the embodiment shown, Edge Bevel Removal (EBR) process includes rotation at a sufficiently slow rotation rate of 200 rpm, wherein the rotatable edge grip portion 856 in not rotated into a holding position as previously described. Referring also to FIG. 28, an isometric section view of the spin-rinse-dryer 800 with surface tension etch applicator 808 is shown, in FIG. 28, a side section isometric close-up is shown with rotatable edge grip portion 856 rotated in the holding position as the rotary chuck 806 accelerates past a critical speed, for example, 600 rpm or otherwise. The surface tension etch applicator (STEA) 808 is shown in a retracted position so as not to interfere with the grip portions of the rotary chuck 806.

Figure 29:
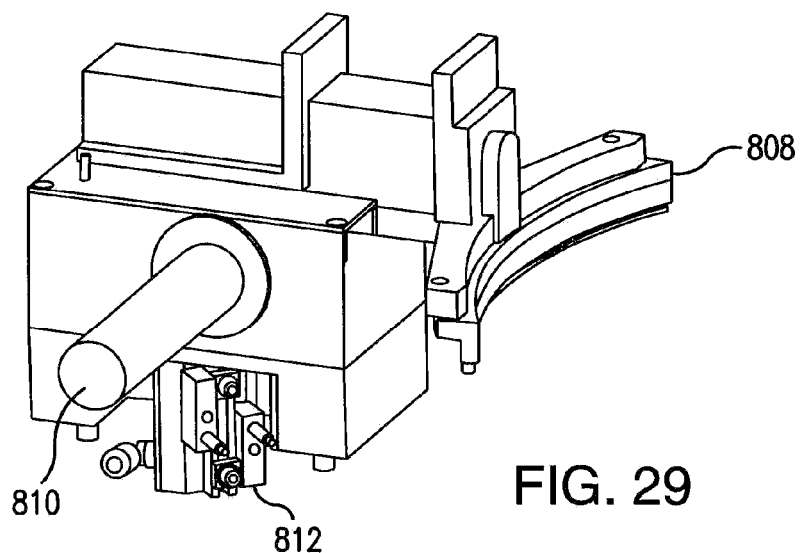
FIG. 29 shows an isometric view of a surface tension etch applicator.

Referring now to FIG. 29, air isometric view of the surface tension etch applicator 808 with the surface tension etch applicator (STEA) is shown. Vertical pins or other suitable guidance may provide alignment to chuck rotation center and guide unit during vertical motion. Vertical motion may be provided by actuator 812, such as a pneumatic cylinder, located below the assembly, wherein, horizontal motion may be provided with actuator 810. In alternate embodiments, any suitable closed or open loop position, and locomotion actuation may be provided to selectively position surface tension etch applicator 808 in any position via one, two or more axes of translation and/or rotation.

Figure 30:
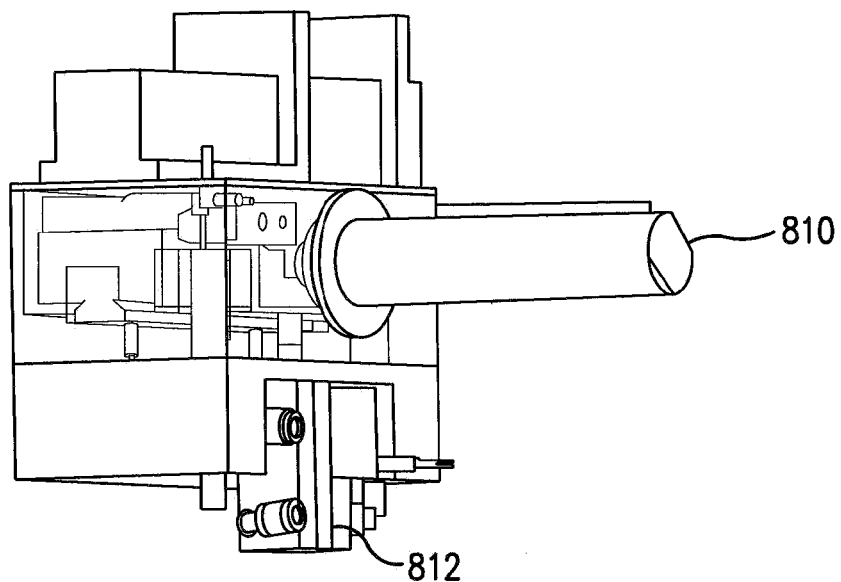
FIG. 30 shows an isometric view of a surface tension etch applicator.

Referring also to FIG. 30, an isometric view of the surface tension etch applicator (STEA) 808 is shown. Actuator 810, which may include an electric motor, gearbox, and encoder, may provide horizontal motion of the surface tension etch applicator (STEA) 808. Horizontal motion may be guided by high precision linear motion guides, such as high precision linear guides commercially available from THK America, Inc. (Chicago, Ill.). The horizontal motion may be provided at micron level alignment and motion, wherein locomotion may be provided through a rack and pinion mechanism. One or more positions may be located using an optical sensor.

Figure 31:
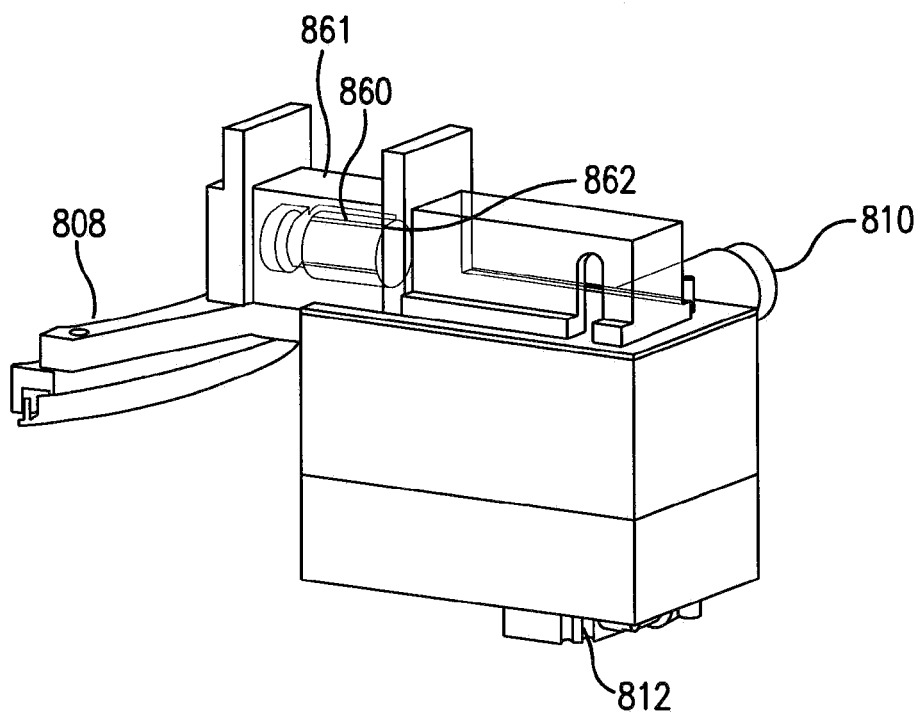
FIG. 31 shows an isometric view of a surface tension etch applicator.

Referring also to FIG. 31, an isometric view of a surface tension etch applicator (STEA) 808 is shown. In FIG. 31, a side view is shown of the mechanism showing an etchant compression fitting 860 coupled to an upper portion of the surface tension etch applicator (STEA) 808. A cover 861 shown enveloping the etchant compression fitting 860 may be provided to prevent particles generated during motion of the etchant compression fitting 860 from entering the spin-rinse-dryer (SRD) volume. Etchant tubing may exit at the notch 862 at the end of the cover and may go directly to an Edge Revel Removal (EBR) containment area.

Figure 32:
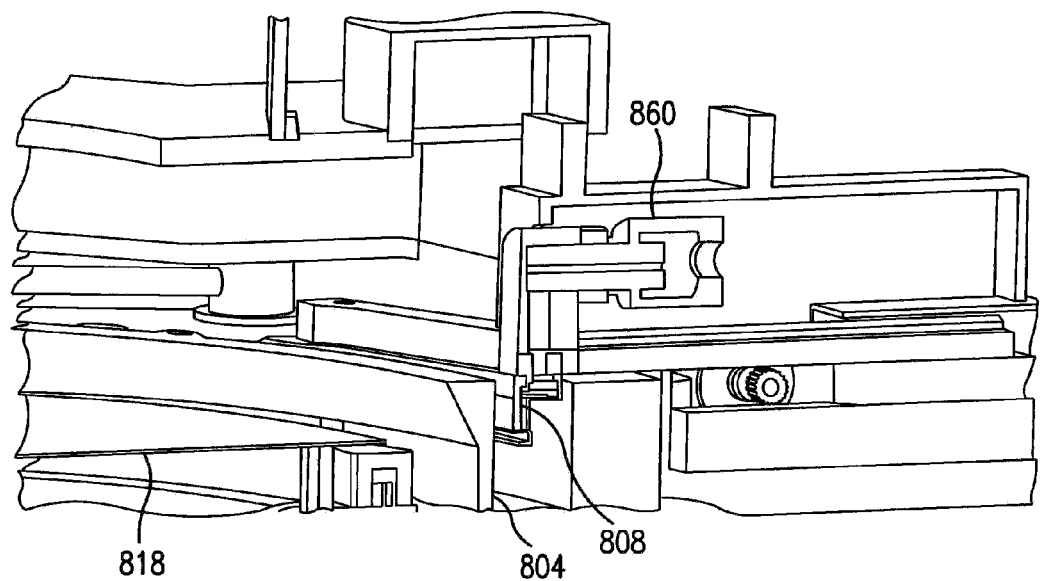
FIG. 32 shows an isometric section view of a spin rinse dryer with a surface tension etch applicator.
Figure 33:
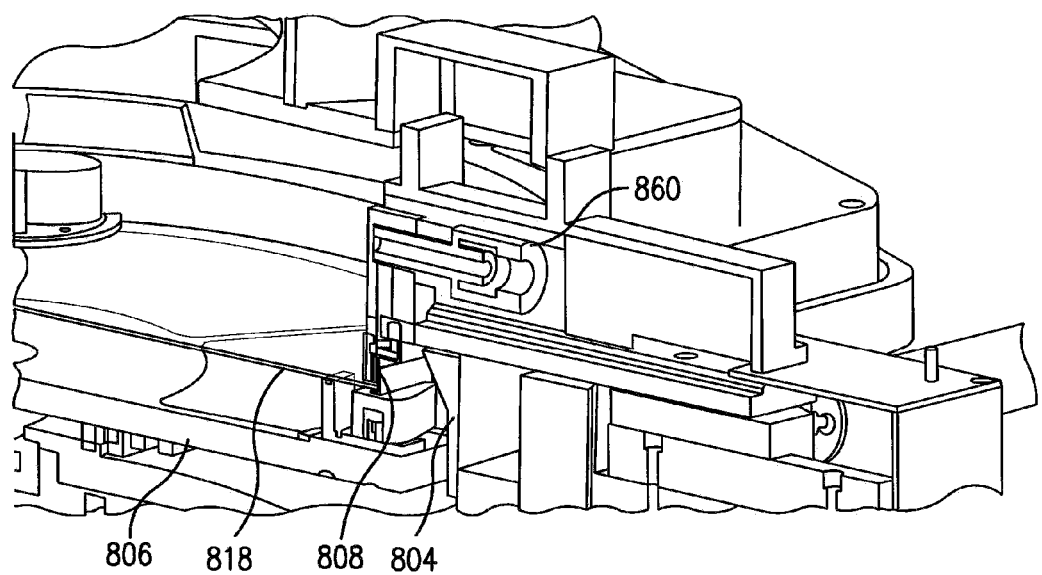
FIG. 33 shows an isometric section view of a spin rinse dryer with a surface tension etch applicator.

Referring also to FIG. 32, an isometric section view of the spin-rinse-dryer 800 with surface tension etch applicator (STEA) 808 is shown. In FIG. 32, a side section isometric view is provided showing Edge Bevel Removal (EBR) cover 870 providing cover seal during rinse and drying operations. The surface tension etch applicator (STEA) 808 is shown retracted. Referring also to FIG. 33, an isometric section view of the spin-rinse-dryer 800 with, surface tension etch applicator (STEA) 808 is shown. In FIG. 33, a side section isometric view is provided showing an Edge Bevel removal (ERR) cover 870 providing cover seal during etching operation. The surface tension etch applicator (STEA) 808 is shown, extended past air diverter 804.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this inversion.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate edge bevel etch module adapted to etch a material from a peripheral edge of a substrate with an etchant, the substrate edge bevel etch module comprising:
   a rotatable substrate holder having a support configured to support and rotate a substrate; and
   a surface tension etch applicator comprising a wetted etching surface configured to oppose a substrate surface proximate an edge of said substrate when said surface tension etch applicator is located proximate to said edge of said substrate to etch the edge of the substrate without etching central portions of the substrate, and wherein said surface tension etch applicator is mounted such that the rotatable substrate holder rotates the substrate relative to the surface tension etch applicator, said surface tension etch applicator further includes an etchant dispensing portion proximate said wetted etching surface that is adapted to dispense an etchant in a region between said wetted etching surface and said substrate surface and wet at least a portion of said wetted etching surface and said substrate surface as the substrate is rotated relative to the surface tension etch applicator, wherein a spacing between said wetted etching surface and said substrate surface can be selected to retain said etchant using surface tension forces and form a meniscus between the wetted etching surface and the substrate;
   an applicator positioning system which moves the surface etch applicator vertically between a non-etch position in which the surface tension etch applicator is raised and spaced above the substrate and an etching position in which the surface tension etch applicator is moved vertically toward the substrate such that the wetted etching surface is proximate the edge of the substrate for etching.

2. The substrate edge bevel etch module of claim 1, wherein said surface tension etch applicator further comprises an etchant aspirating portion proximate said wetted etching surface that is adapted to aspirate said etchant from said region between said wetted etching surface and said substrate surface.

3. The substrate edge bevel etch module of claim 1, wherein said wetted etching surface includes a first surface that extends over an upper surface of said substrate, and a second surface that is located radially beyond said edge of said substrate, and wherein a highest surface portion of said wetted etching surface extends further radially inwardly relative to said substrate than a lowest surface portion of said wetted etching surface.

4. The substrate edge bevel etch module of claim 1, wherein said surface tension etch applicator comprises a recess having said wetted etching surface formed on an interior surface thereof, and wherein said edge of said substrate extends into said recess during dispensing of said etchant.

5. The substrate edge bevel etch module of claim 1, wherein at least a portion of said wetted etching surface comprises a radial dimension that extends a radial distance over or below said substrate surface, and wherein said wetted etching surface has an arcuate shape having an arcuate dimension that extends an angular distance along said edge of said substrate during dispensing of said etchant.

6. The substrate edge bevel etch module of claim 5, wherein said etchant dispensing portion comprises one or more openings fluidically coupled to said wetted etching surface and distributed along said arcuate dimension.

7. The substrate edge bevel etch module of claim 1, wherein the applicator positioning system translates said surface tension etch applicator in a radial direction relative to said substrate surface and controls said spacing between said wetted etching surface and said substrate surface.

8. The substrate edge bevel etch module of claim 7, wherein said applicator positioning system controls a distance said wetted etching surface extends over or below said substrate surface.

9. The substrate edge bevel etch module of claim 1, further comprising:
an etchant dispense and control system coupled to said surface tension etch applicator and configured to control an etchant concentration, an etchant composition, or an etchant flow rate, or any combination of two or more thereof.

10. The substrate edge bevel etch module of claim 1, further comprising:
an applicator temperature control system coupled to said surface tension etch applicator and configured to control a temperature of said etchant, or a temperature of said surface tension etch applicator, or a combination thereof.

11. The substrate edge bevel etch module of claim 1, further comprising:
an etchant exit guide feature coupled directly to or arranged proximate with said surface tension etch applicator, and configured to guide said etchant from said wetted etching surface and away from said substrate.

12. The substrate bevel etch module of claim 1, wherein said surface tension etch applicator extends along a dimension corresponding to only a portion of a periphery of the substrate, and wherein along said portion said surface tension etch applicator extends over a top surface of the portion of the periphery such that said wetted etching surface extends over a portion of an upper edge surface of the substrate, and wherein an entirety of the upper edge surface is wetted and etched as the substrate is rotated relative to and past the surface tension etch applicator; and
wherein the applicator positioning system moves the surface tension applicator in a radial direction relative to the substrate.

13. The substrate bevel etch module of claim 12, wherein the rotatable substrate holder rotates the substrate with the substrate supported from under a bottom surface of the substrate which is on an opposite side of the substrate than the upper edge surface over which the wetted etching surface extends.

14. The substrate edge bevel etch module of claim 1, wherein the each module comprises a process module having an air diverter extending about a periphery thereof, and wherein the rotatable substrate holder is positioned radially inside of the air diverter;
wherein when the positioning system positions the surface tension etch applicator in the etching position, the surface tension etch applicator is positioned radially inside of the air diverter;
wherein after etching, the process module performs a drying operation, and wherein a controller controls a rotation speed of the rotatable substrate holder such that:
(i) during etching, the rotatable substrate holder rotates at a first speed; and
(ii) during drying, the rotatable substrate holder rotates at a second speed which is faster than said first speed; and
wherein during drying, the positioning system positions the surface tension etch applicator at a location which is at least one of above the air diverter or radially outside of the air diverter.

15. A substrate edge bevel etch apparatus configured to be coupled to a substrate processing module and adapted to etch a material from a peripheral edge of a substrate with an etchant, the substrate edge bevel etch apparatus comprising:
a rotatable substrate holder which rotates a substrate with the substrate positioned above the rotatable substrate holder such that the substrate is supported from under a bottom surface of the substrate while being rotated;
a surface tension etch applicator comprising a wetted etching surface configured to oppose a substrate surface proximate an edge of a substrate when said surface tension etch applicator is located proximate to said edge of said substrate, and wherein said surface tension etch applicator is mounted such that the rotatable substrate holder rotates the substrate relative to the surface tension etch applicator, said surface tension etch applicator further includes an etchant dispensing portion proximate said wetted etching surface that is adapted to dispense an etchant in a region between said wetted etching surface and said substrate surface and wet at least a portion of said wetted etching surface and said substrate surface as the substrate is rotated relative to the surface tension etch applicator;
wherein said surface tension etch applicator extends along a dimension corresponding to only a portion of a periphery of the substrate, and wherein along said portion said surface tension etch applicator extends over a top surface of the portion of the periphery such that said wetted etching surface extends over a portion of an upper edge surface of the substrate, and wherein an entirety of the upper edge surface is wetted and etched as the substrate is rotated relative to and past the surface tension etch applicator;
an applicator positioning system which moves the surface etch applicator vertically between a non-etch position in which the surface tension etch applicator is raised and spaced above the substrate and an etching position in which the surface tension etch applicator is moved vertically toward the substrate such that the wetted etching surface is proximate the edge of the substrate for etching.

16. The substrate edge bevel etch apparatus of claim 15, wherein at least a portion of said wetted etching surface comprises a radial dimension that extends a radial distance over or below said substrate surface and wherein said wetted etching surface has an arcuate shape having an arcuate dimension that extends an angular distance along said edge of said substrate during dispensing of said etchant.

17. The substrate edge bevel etch apparatus of claim 16, wherein said etchant dispensing portion comprises one or more openings fluidically coupled to said wetted etching surface and distributed along said arcuate dimension.

18. The substrate edge bevel etch apparatus of claim 15, wherein the applicator positioning system translates said surface tension etch applicator relative to said substrate surface and controls said spacing between said wetted etching surface and said substrate surface.

19. The substrate bevel etch apparatus according to claim 15, wherein the applicator positioning system moves the surface tension etch applicator in a radial direction relative to the substrate.

20. The substrate edge bevel etch module of claim 15, wherein the each module comprises a process module having an air diverter extending about a periphery thereof, and wherein the rotatable substrate holder is positioned radially inside of the air diverter;
  wherein when the positioning system positions the surface tension etch applicator in the etching position, the surface tension etch applicator is positioned radially inside of the air diverter;
  wherein after etching, the process module performs a drying operation, and wherein a controller controls a rotation speed of the rotatable substrate holder such that:
    (i) during etching, the rotatable substrate holder rotates at a first speed; and
    (ii) during drying, the rotatable substrate holder rotates at a second speed which is faster than said first speed; and
  wherein during drying, the positioning system positions the surface tension etch applicator at a location which is at least one of above the air diverter or radially outside of the air diverter.

21. A method of etching a material from a peripheral edge of a substrate with an etchant, comprising:
  placing a substrate on a rotatable substrate holder;
  locating a surface tension etch applicator proximate an edge of said substrate such that a wetted etching surface of said surface tension etch applicator is positioned opposite a substrate surface, wherein said surface tension etch applicator further includes an etchant dispensing portion proximate said wetted etching surface that is adapted to dispense an etchant in a region between said wetted etching surface and said substrate surface and wet at least a portion of said wetted etching surface and said substrate surface;
  selecting a spacing between said wetted etching surface and said substrate surface to retain said etchant using surface tension forces and form a meniscus between the wetted etching surface and the substrate, and controlling said spacing by sending at least one control signal to an applicator positioning system coupled to said surface tension etch applicator and configured to effect movement of said surface tension etch applicator, and wherein said applicator positioning system moves the surface etch applicator vertically between a non-etch position in which the etch applicator is raised and spaced above the substrate and an etching position in which the surface tension etch applicator is moved vertically toward the substrate such that the wetted etching surface is proximate the edge of the substrate for etching;
  rotating said rotatable substrate holder to rotate the substrate relative to the surface tension etch applicator with the surface tension etch applicator in the etching position; and
  dispensing said etchant within said region between said wetted etching surface and said substrate surface such that the peripheral edge of the substrate is wetted and etched as it is rotated past the wetted etching surface without etching central portions of the substrate.

22. The method of claim 21, further comprising:
  controlling a rotation rate of said rotatable substrate holder, an acceleration rate of said rotatable substrate holder, a deceleration rate of said rotatable substrate holder, said spacing between said wetted etching surface and said substrate surface, a concentration of said etchant, a composition of said etchant, a flow rate of said etchant, a temperature of said etchant, or a temperature of said surface tension etch applicator, or any combination of two or more thereof.

23. A method according to claim 21, further including:
  positioning the surface tension etch applicator such that it extends over only a portion of an upper edge surface of the substrate;
  supporting the substrate on the rotatable substrate holder from a bottom of the substrate which is on an opposite side of the substrate than the upper edge surface, and rotating the substrate such that an entirety of the upper edge surface is wetted and etched as the substrate is rotated past the surface tension etch applicator.

24. A method according to claim 23, wherein the applicator positioning system controls a distance between the wetted etching surface and the substrate by moving the surface tension etch applicator in both a radial direction relative to the substrate and the vertical direction relative to a top surface of the substrate.

25. The method of claim 21, wherein the module comprises a process module having an air diverter extending about a periphery thereof and wherein the rotatable substrate holder is positioned radially inside of the air diverter;
  wherein when the positioning system positions the surface tension etch applicator in the etching position, the surface tension etch applicator is positioned radially inside of the air diverter;
  wherein after etching, the process module performs a drying operation, and wherein a controller controls a rotation speed of the rotatable substrate holder such that:
    (i) during etching, the rotatable substrate holder rotates at a first speed; and
    (ii) during drying, the rotatable substrate holder rotates at a second speed which is faster than said first speed; and
  wherein during drying, the positioning system positions the surface tension etch applicator at a location which is at least one of above the air diverter or radially outside of the air diverter.

* * * * *